US006314553B1

(12) United States Patent
Stevens et al.

(10) Patent No.: US 6,314,553 B1
(45) Date of Patent: Nov. 6, 2001

(54) CIRCUIT SYNTHESIS AND VERIFICATION USING RELATIVE TIMING

(75) Inventors: Kenneth S. Stevens, Hillsboro, OR (US); Shai Rotem, Hofit (IL); Ran Ginosar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/184,417

(22) Filed: Nov. 2, 1998

(51) Int. Cl.$^7$ .............................. G06F 17/10; G06F 7/60

(52) U.S. Cl. .................................... 716/18; 716/3; 716/1; 716/4; 716/6

(58) Field of Search ................................. 716/1, 4, 5, 6, 716/18, 3

(56) References Cited

U.S. PATENT DOCUMENTS

| | | | |
|---|---|---|---|
| 5,469,367 | 11/1995 | Puri et al. | 364/489 |
| 5,748,487 | 5/1998 | Sawasaki et al. | 364/489 |
| 5,752,070 | 5/1998 | Martin et al. | 395/800.33 |
| 5,901,063 | * 5/1999 | Chang et al. | 716/4 |
| 5,930,148 | * 7/1999 | Bjorksten et al. | 716/6 |
| 5,953,236 | * 9/1999 | Hossain et al. | 716/6 |
| 5,956,497 | * 9/1999 | Ratzel et al. | 716/1 |
| 6,009,252 | * 12/1999 | Lipton | 716/5 |

OTHER PUBLICATIONS

Negulescu, R. et al, "Verification of speed–dependences in single–cell handshake circuits", 4th International Symposium on Advanced Research in Asynchronous Circuits & Systems, Apr. 1998.*

Cortadella, J., et al., "Petrify: a tool for manipulating concurrent specifications and synthesis of asynchronous controllers", *IEICE Transactions on Information and Systems*, E80–D (3), pp. 315–325, (Mar. 1, 1997).

Stevens, K., et al., "CAD directions for high performance asynchronous circuits", *Proceedings of the Design Automation Conference*, New Orleans, LA, pp. 116–121, (Jun. 1999).

Stevens, K., et al., "Relative Timing", *Proceedings of the 5th International Symposium on Advanced Research in Asynchronous Circuits and Systems*, Barcelona, Spain, pp. 208–218, (Apr. 19–21, 1999).

Vanbekbergen, P., et al., "A design and validation system for asynchronous circuits", *Proceedings of the 32nd Design Automation Conference*, San Francisco, CA, pp. 725–730, (Jun. 12, 1995).

Chakraborty, S., et al., "Timing Analysis for Extended Burst–Mode Circuits", *IEEE Computer Soc.*, 101–111, (1997).

David, I., et al., "Self–Timed Architecture of a Reduced Instruction Set Computer", *Proceedings of the IFIP WG10.5 Working Conference on Asynchronous Design Methodologies*, A–28, Manchester, UK, 29–43, (Mar. 31–Apr. 2, 1993).

Davis, A., et al., "Automatic Synthesis of Fast Compact Asynchronous Control Circuits", *Proceedings of the IFIP WG10.5 Working Conference on Asynchronous Design Methodologies*, A–28, Manchester, UK, 193–207, (Mar. 31,–Apr. 2, 1993).

(List continued on next page.)

*Primary Examiner*—Matthew Smith
*Assistant Examiner*—Jibreel Speight
(74) *Attorney, Agent, or Firm*—Schwegman, Lundberg, Woessner & Kluth, P.A.

(57) ABSTRACT

A system and method of synthesizing and/or verifying a circuit from a behavioral description of that circuit. A signal ordering of signals in the circuit is defined, wherein defining a signal ordering of signals in the circuit includes specifying a relative ordering of a plurality of events within the circuit. The behavioral description is modified as a function of the signal ordering. The circuit is then synthesized and/or verified as a function of the modified behavioral description.

29 Claims, 27 Drawing Sheets

OTHER PUBLICATIONS

Myers, C.J., *Computer–Aided Synthesis and Verification of Gate–Level Timed Circuits (Asynchronous Circuits)*, A Dissertation submitted to the Department of Electrical Engineering and the Committee on Graduate Studies of Stanford University in Partial Fulfillment of the Requirements for the Degree of Doctor of Philosophy, 1–127 p., (Oct. 1995).

Negulescu, R., et al., "Verification of Speed–Dependences in Single–Rail Handshake Circuits", *IEEE Computer Soc.*, 1–13 p., (Mar./Apr. 1998).

* cited by examiner

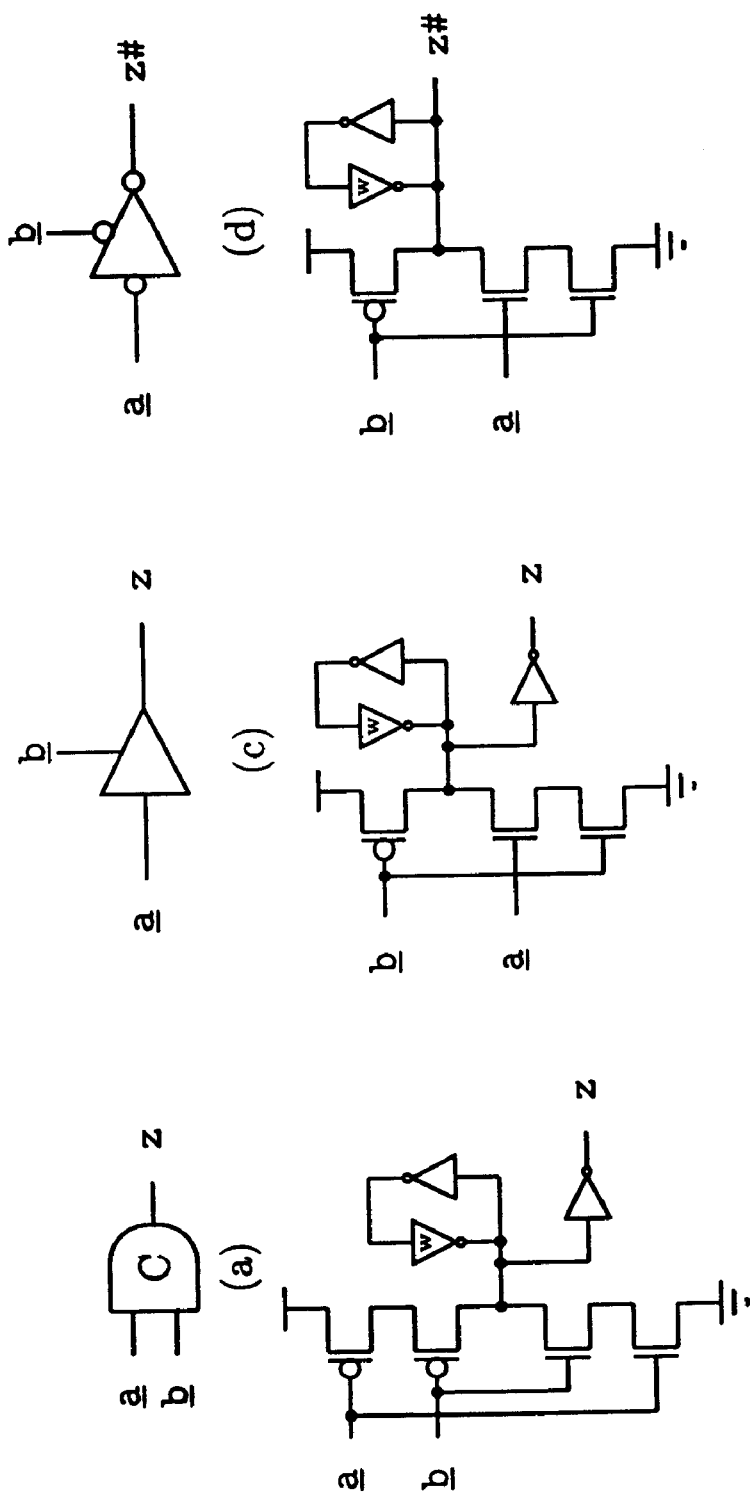
Figure 5: Generalized C-Elements: (a) gC, (b) for $\underline{a} \curlyvee \underline{b}$, (c) for $\underline{a}\downarrow \curlyvee \underline{b}\downarrow$, gC=wire, (d) for $\underline{a}\uparrow \curlyvee \underline{b}\uparrow$

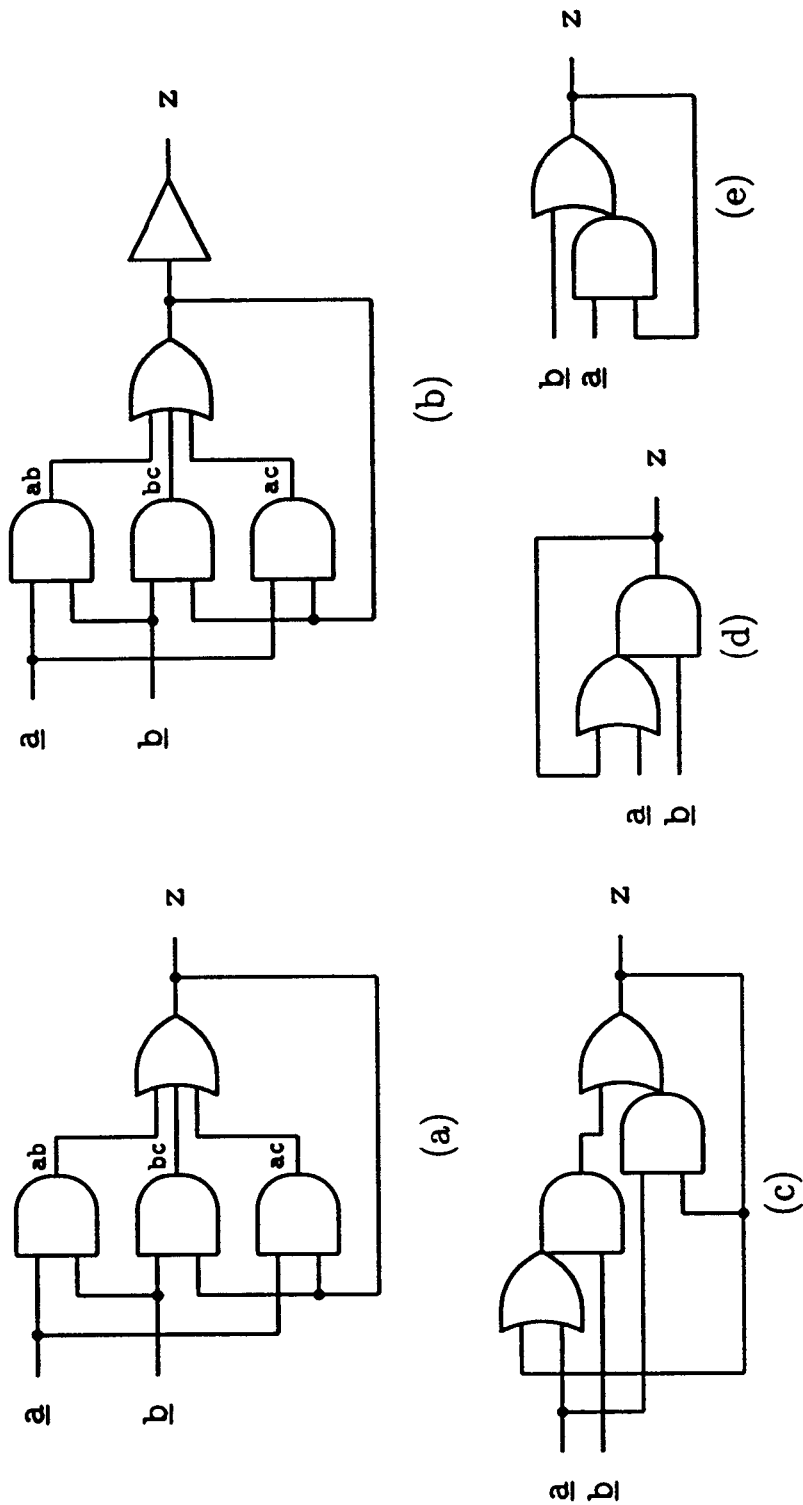
Figure 6: Static C-Elements: (a) C-Element with hazards, (b) locally timed, (c) Speed-Independent, (d) with RT predicate $\underline{a}\downarrow \prec \underline{b}\downarrow$, (e) with RT predicate $\underline{a}\uparrow \prec \underline{b}\uparrow$

| Circuit | Has HF circuit | Fall delay | Rise delay | Energy (pJ) | Area | Test C-Elt | Test Spec RT2 |
|---|---|---|---|---|---|---|---|
| SIC | Yes | 1170 | 1190 | 20.2 | 16 | 100% | 90% |
| SC | No | 700 | 545 | 11.6 | 18 | 100% | 92% |
| GC | Yes | 640 | 585 | 11.1 | 10 | 100% | 100% |
| SIC-RT | Yes | 735 | 785 | 14.0 | 8 | - | 100% |
| GC-RT | Yes | 530 | 600 | 11.6 | 9 | - | 100% |

Fig. 7: Comparison of C-Element implementations. Rise and fall times are in pS. Energy is per a complete cycle (rise and fall). Area is the number of transistors. Test columns show coverage using pseudo-stuck-at fault model on all inputs, outputs, and wire forks for the original specification and with RT2.

Fig. 7

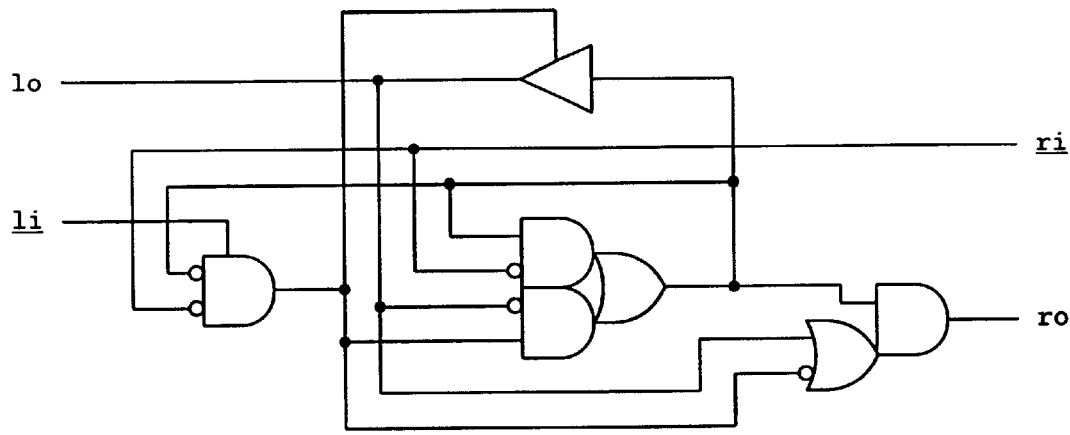
Fig. 9a: Speed-Independent FIFO cell
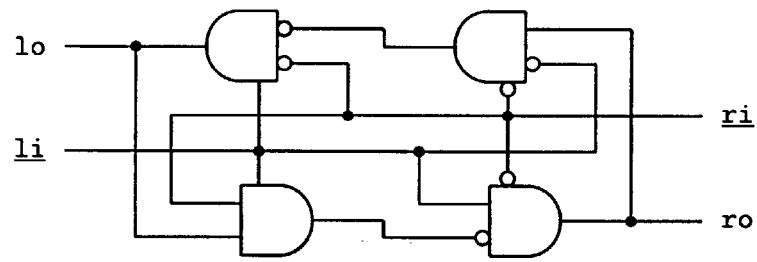
Fig. 9b

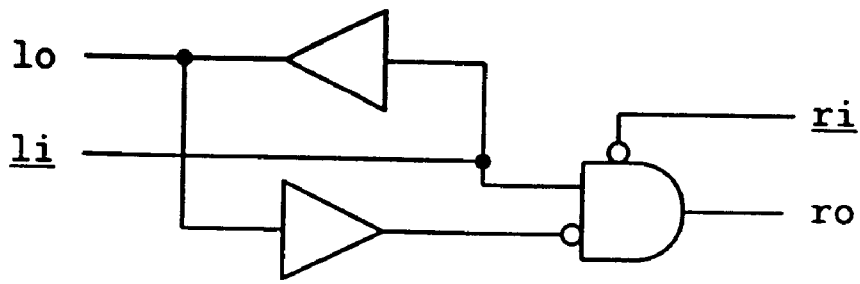
Figure 9c: Aggressive Relative Timed FIFO cell
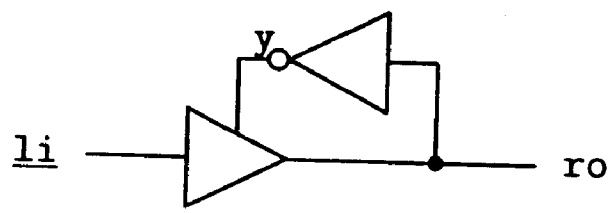
Figure 9d: Relative Timed Pulse-Mode FIFO

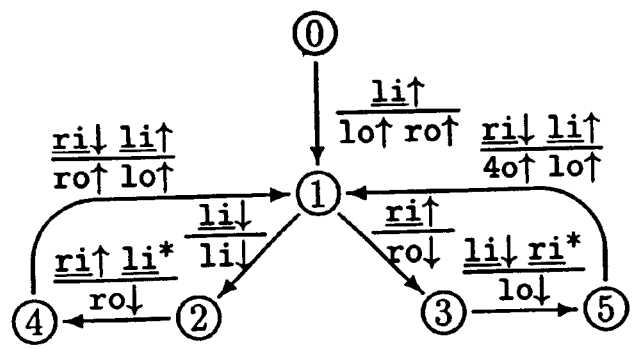
Fig. 10
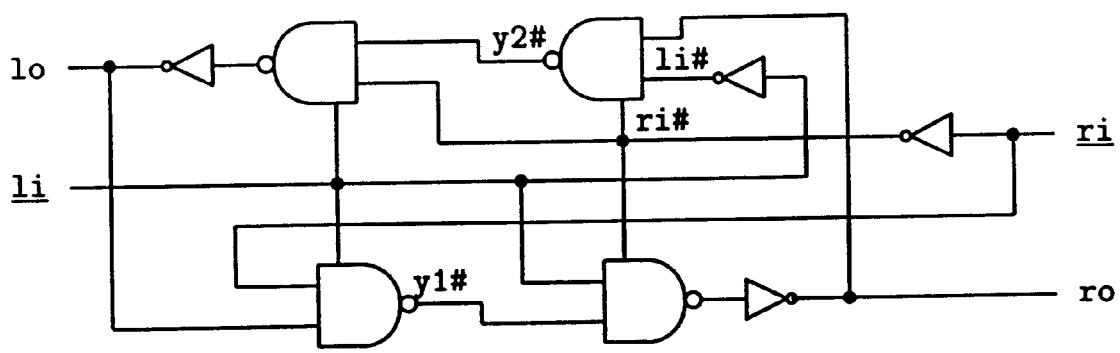
Figure 11: Relative Timed Burst-Mode FIFO implementation

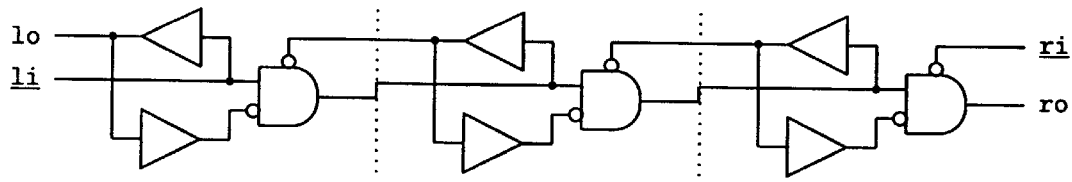
Figure 12: Aggressive Relative Timed FIFO cell
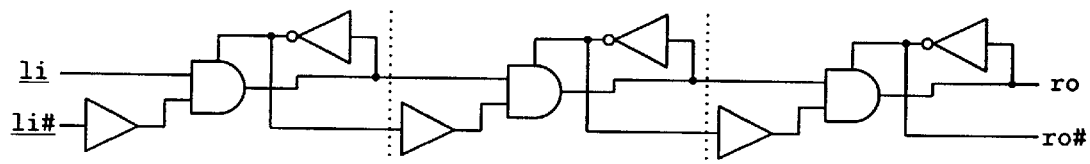
Figure 13: Shuffled Aggressive Relative Timed FIFO cell
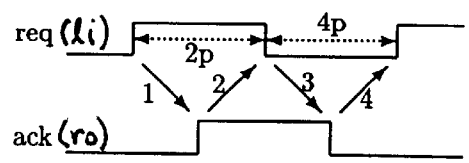
Figure 14: Four Cycle and Pulse Handshake Protocol Constraints

| Circuit | HF Impl. | Worst delay | Ave. delay | pJ | Area | Test SI | Test RT13 | Test pulse |
|---|---|---|---|---|---|---|---|---|
| SI | Yes | 2160 | 1560 | 37.6 | 39 | 98% | 91% | - |
| RT-BM | No | 1020 | 550 | 32.2 | 40 | 95% | 74% | - |
| RT-Agr | No | 595 | 390 | 18.2 | 20 | - | 100% | - |
| Pulse | No | 350 | 350 | 16.2 | 17 | - | - | 100% |

Fig. 15

Speed-Independent Tag Unit. Assumes ti's are mutex.

Speed-Independent Tag Unit Circuits: (a) PA (b) PB (c) C4

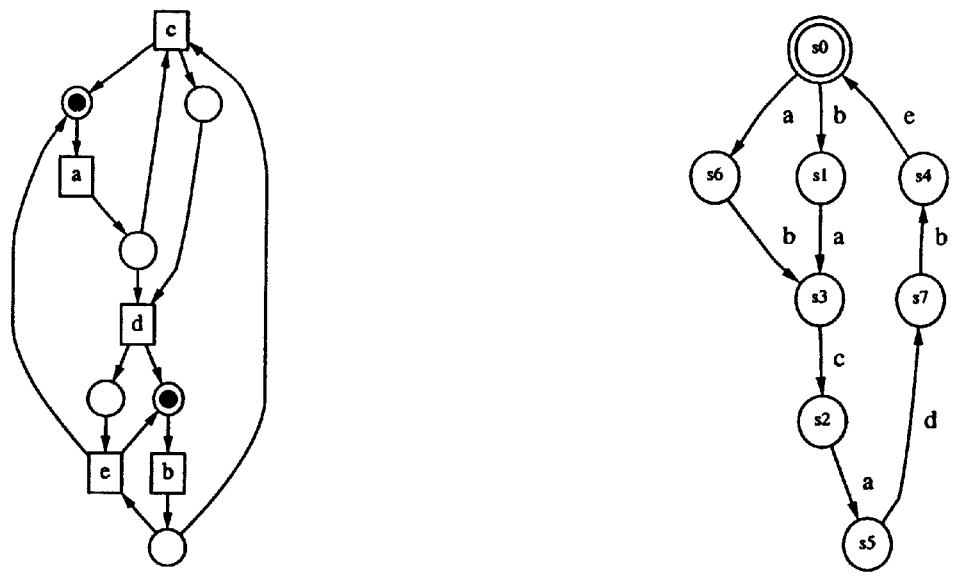
Figure 18 Illustration of timing assumptions on event ordering.
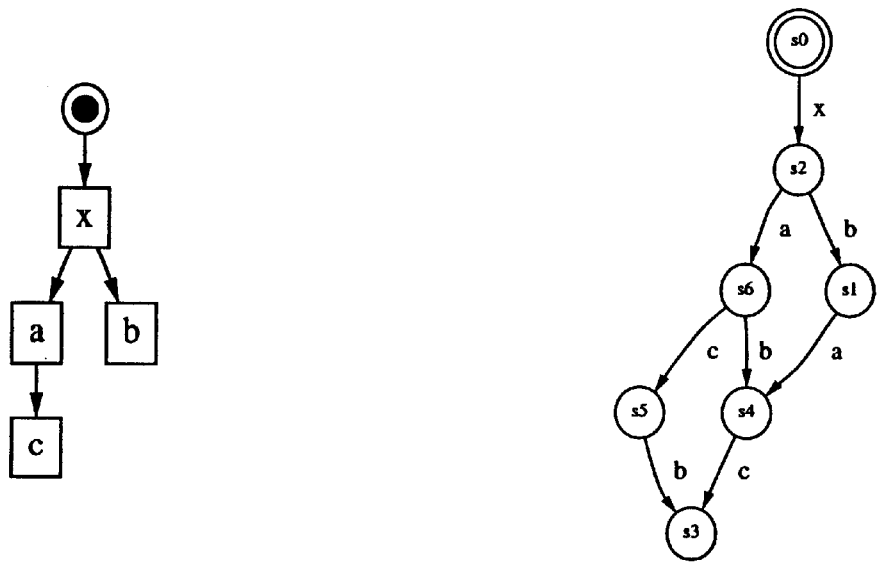
Figure 19: Simultaneity timing assumptions

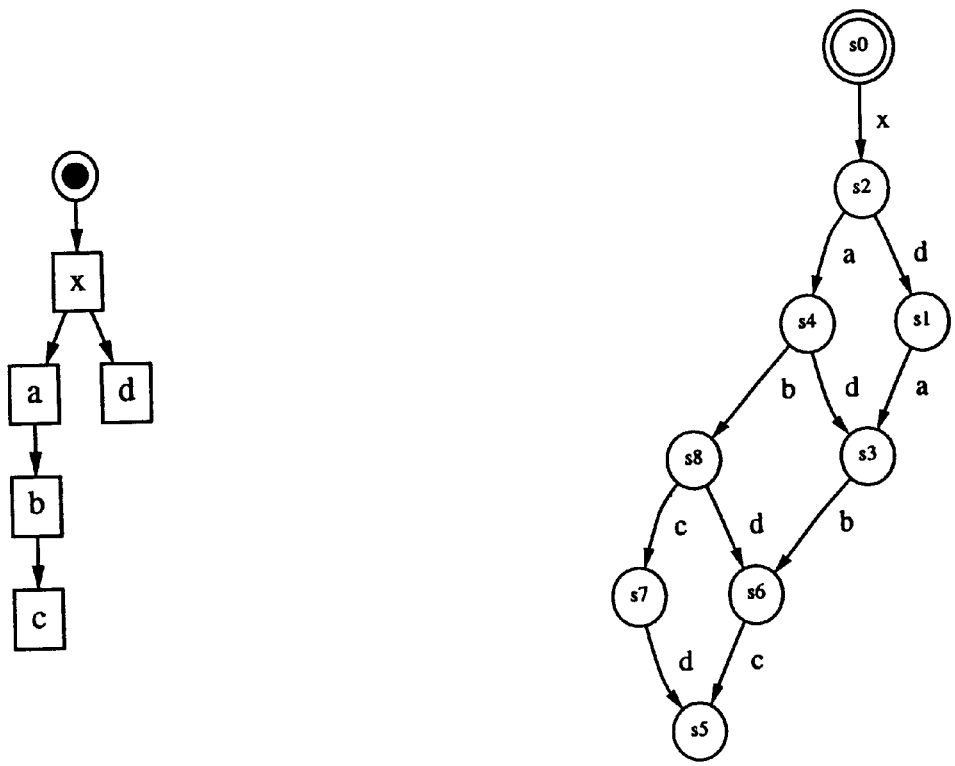
Figure 20.: Example to illustrate early enabling assumptions.
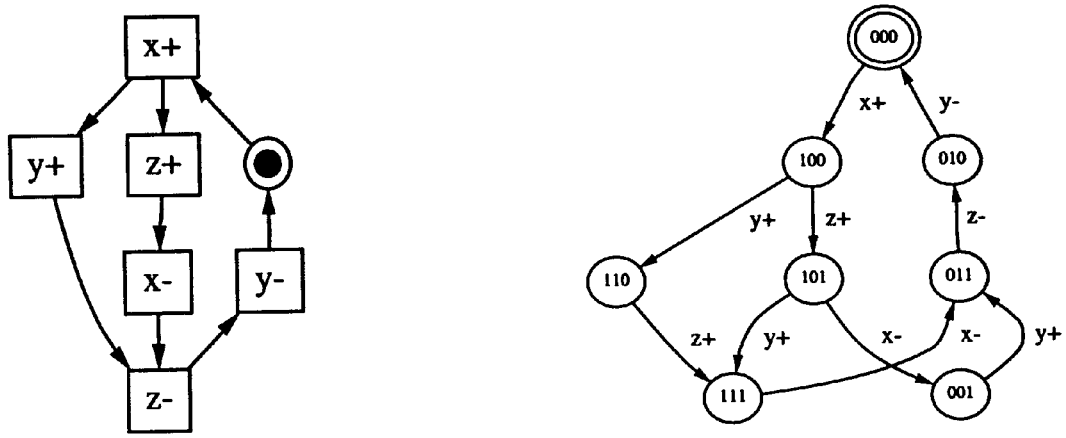
Figure 21.: The $xyz$ example.

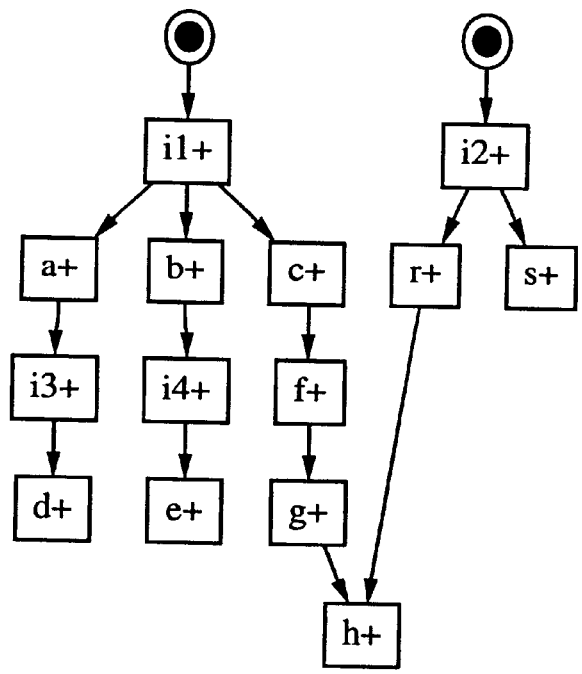
Figure 22: Example for automatic generation of timing assumptions.
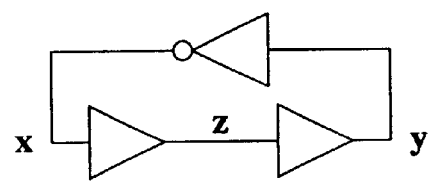
Figure 23: Optimized circuit for the $xyz$ example.

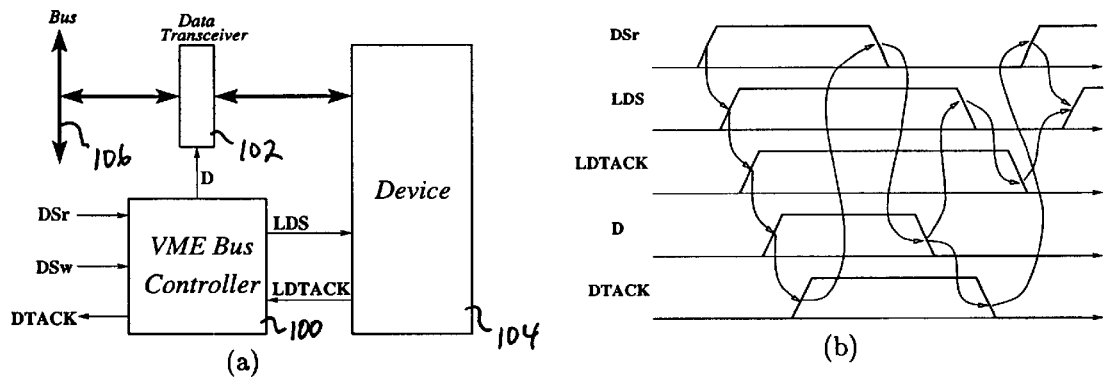
Figs. 24a+b
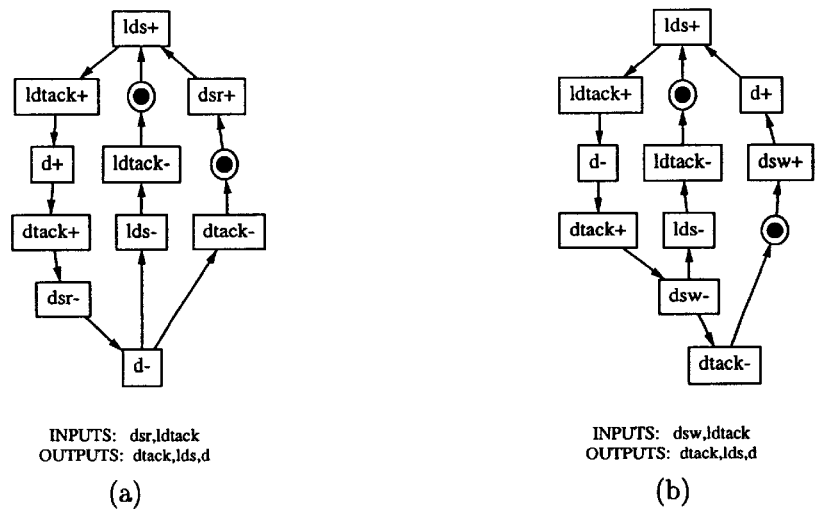
Figs. 25a+b

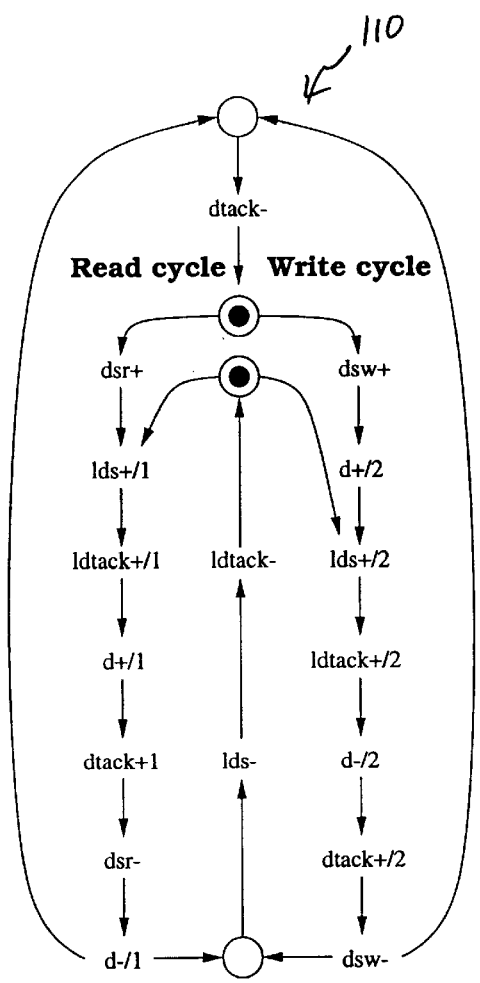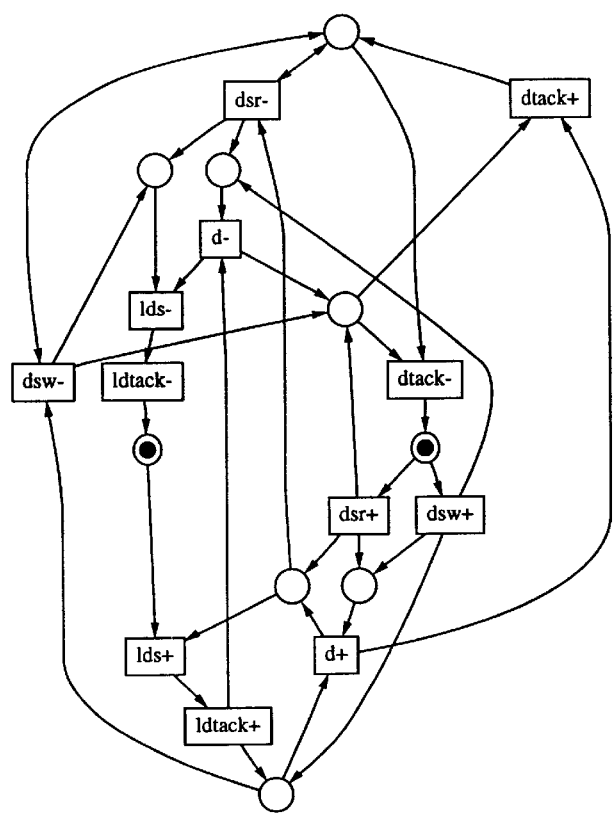
Fig. 26 (a)
Fig. 26 (b)
INPUTS: dsr,dsw,ldtack
OUTPUTS: dtack,lds,d

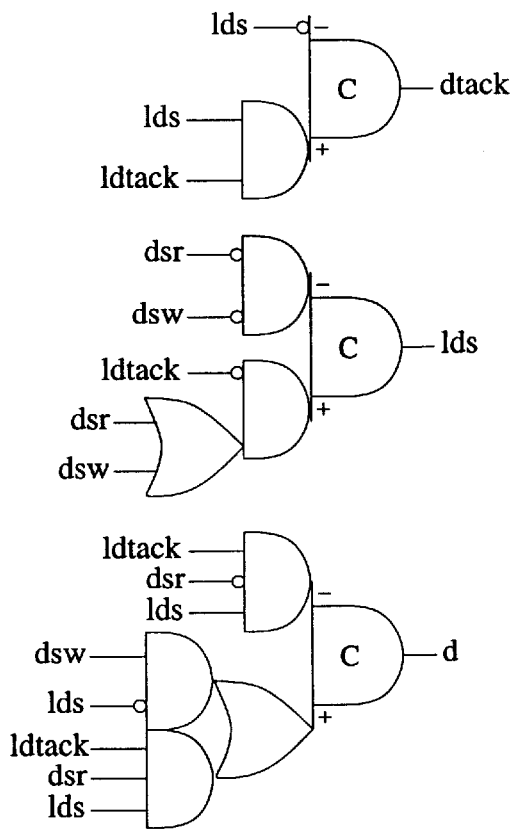
Figure 30: Circuit under the assumption of slow environment and lds- <| dtack-.

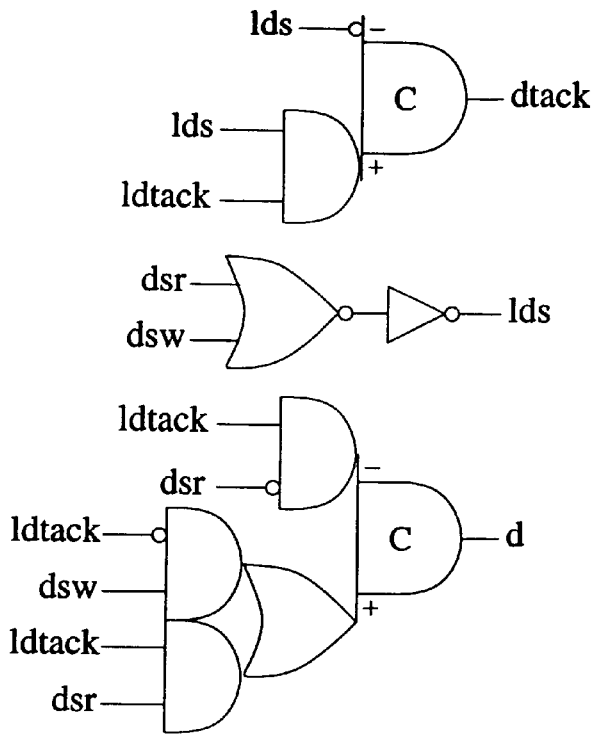
Figure 31: Circuit under the assumption of a slow bus control logic.
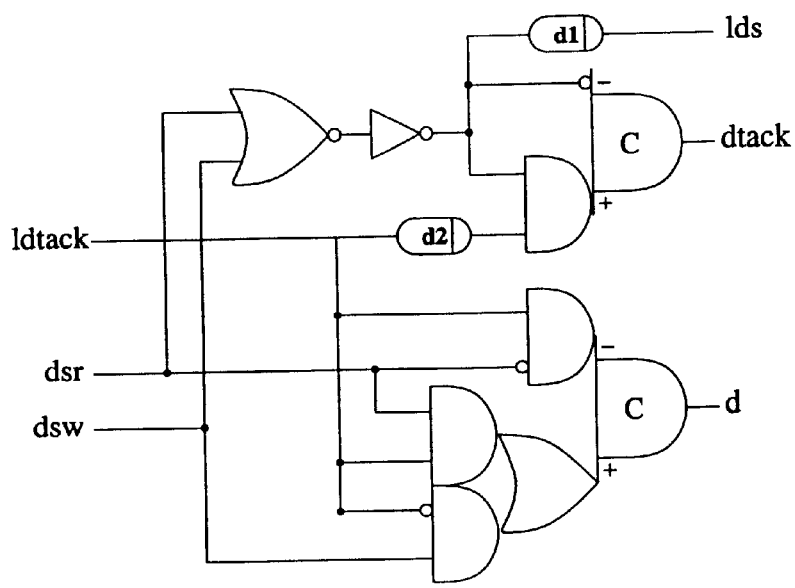
Figure 33: Delay padding to satisfy timing assumptions.

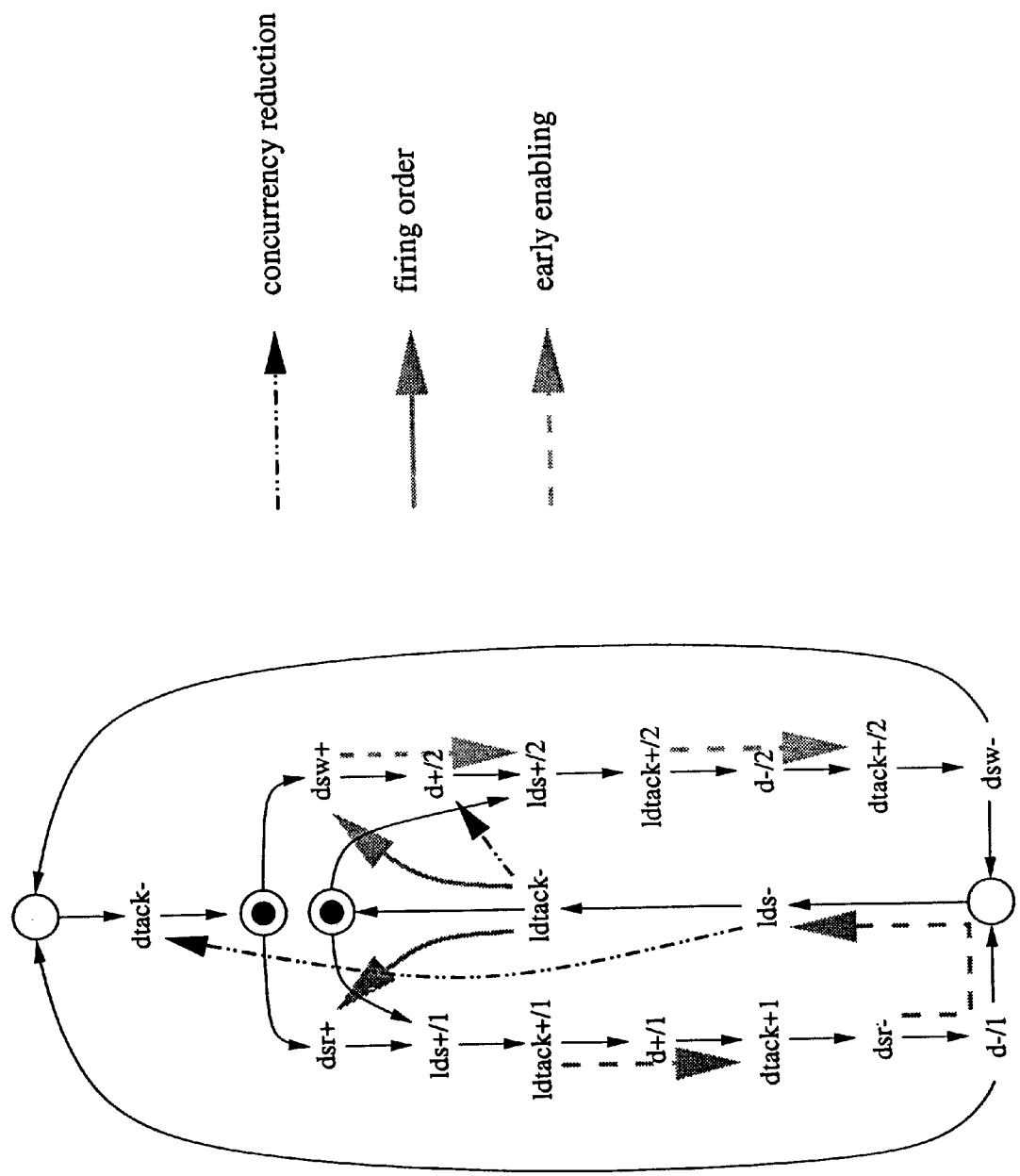
Figure 32: Timing assumptions for the final solution of the VME bus.

CIRCUIT SYNTHESIS AND VERIFICATION USING RELATIVE TIMING

FIELD OF THE INVENTION

The present invention is related to integrated circuit fabrication, and more particularly to a system and method for synthesizing and verifying a timed circuit based on a behavioral description.

BACKGROUND INFORMATION

The design of timing in digital circuits is an extremely difficult challenge. Conventional clocked digital design solves this problem by decomposing the circuit into cycle-free combinational logic (CL) stages and interstage clocked latches; the clock cycle is simply tuned to accommodate the worst-case propagation delay in the CL stages. The behavior of the combinational logic can then be specified and synthesized without considering timing. Speed Independent (SI) asynchronous circuits are analogous to clocked CL design because SI circuits are independent of time—the behavior will be correct for any arbitrary gate delay.

High-performance circuits, both clocked and asynchronous, benefit from more aggressive timing methodologies. Clocked circuits can treat time locally to allow adaptive and variable time in different parts of the circuit. Timed asynchronous and sequential circuits can have significantly enhanced performance, at the cost of lower robustness to delay variation.

Metric timing requires the specification of either propagation times or of ranges of propagation times. Unfortunately metric timing analysis can explode in complexity even when simple localized timing is used. The synthesis and verification of even moderate-sized timed circuits can therefore become intractable. Further, accurate metric ranges require layout parameters, which may not be present when a circuit is to be synthesized.

What is needed is a system and method of defining a circuit which frees the circuit from a dependence on propagation delays or on estimates of propagation delays while maintaining synthesis and verification of hazard-free designs.

SUMMARY OF THE INVENTION

According to one aspect of the present invention, a system and method of performing logic synthesis from a behavioral description of a circuit is described. A signal ordering of signals in the circuit is defined, wherein defining a signal ordering of signals in the circuit includes specifying a relative ordering of a plurality of events within the circuit. The behavioral description is modified as a function of the signal ordering. The circuit is then synthesized as a function of the modified behavioral description.

According to another aspect of the present invention, a system and method of verifying a circuit from a behavioral description of that circuit is described. A signal ordering of signals in the circuit is defined, wherein defining a signal ordering of signals in the circuit includes specifying a relative ordering of a plurality of events within the circuit. The behavioral description is modified as a function of the signal ordering. The circuit is then verified as a function of the modified behavioral description.

According to yet another aspect of the present invention, a circuit includes a plurality of transistors and conductors connecting two or more of the plurality of transistors. The conductors are defined and synthesized as a function of a behavioral description of the circuit, wherein the behavioral description includes information specifying a relative ordering between a plurality of events within the circuit.

According to yet another aspect of the present invention, a computer readable medium includes program code for representing a circuit through a behavioral description of the circuit, program code for defining a signal ordering of signals in the circuit, wherein defining includes specifying a relative ordering of a plurality of events within the circuit, program code for modifying the behavioral description as a function of the signal ordering and program code for synthesizing the circuit as a function of the modified behavioral description.

According to yet another aspect of the present invention, a computer readable medium includes program code for representing a circuit through a behavioral description of the circuit, program code for defining a signal ordering of signals in the circuit, wherein defining includes specifying a relative ordering of a plurality of events within the circuit, program code for modifying the behavioral description as a function of the signal ordering and program code for verifying the circuit as a function of the modified behavioral description.

BRIEF DESCRIPTION OF THE DRAWINGS

FIGS. 5a–d illustrate the evolution of a simple two-input generalized C-element through application of a series of relative timing assumptions according to the present invention;

FIGS. 6a–e illustrate the evolution of a static AND-OR C-element through application of a series of relative timing assumptions according to the present invention;

FIG. 7 is a table comparing attributes of the circuits of FIGS. 6a–e;

FIGS. 9a–d illustrate the evolution of a FIFO through application of a series of relative timing assumptions according to the present invention;

FIG. 10 illustrates a 3D state machine;

FIG. 11 illustrates a physical implementation of the circuit definition of FIG. 9b;

FIG. 12 illustrates a relative timed pulse-mode FIFO cell;

FIG. 13 illustrates a shuffled version of the FIFO cell of FIG. 12;

FIG. 14 illustrates a four cycle request-acknowledge handshake;

FIG. 15 is a table comparing attributes of the circuits of FIGS. 9a–d;

FIG. 17 illustrates various elements of the Tag Unit shown in FIG. 16a;

FIG. 18 is an illustration of timing assumptions on event ordering;

FIG. 19 is an illustration of simultaneity timing assumptions;

FIG. 20 is an illustration of early enabling assumptions;

FIG. 21 is an example of an xyz circuit;

FIG. 22 is an example of automatic generation of timing assumptions for the circuit of FIG. 21;

FIG. 23 is an optimized version of the circuit of FIG. 21 according to the present invention;

FIGS. 24a and b illustrate the I/O interface of a VME bus controller;

FIGS. 25a and b illustrate a state graph of the READ and WRITE cycle, respectively for the I/O interface of FIGS. 24a and b;

FIGS. 26a and b illustrate alternate versions of a state graph describing the complete behavior of the I/O interface of FIGS. 24a and b;

FIG. 30 illustrates an alternate relative-timed embodiment of the circuit of FIG. 28a assuming a slow environment; and FIG. 31 illustrates a relative-timed embodiment of the circuit of FIG. 28a assuming a slow environment and slow bus control logic;

FIG. 32 illustrates a timing analysis of the circuit of FIG. 31; and

FIG. 33 illustrates delay padding within FIG. 31 in order to satisfy timing assumptions.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1A:
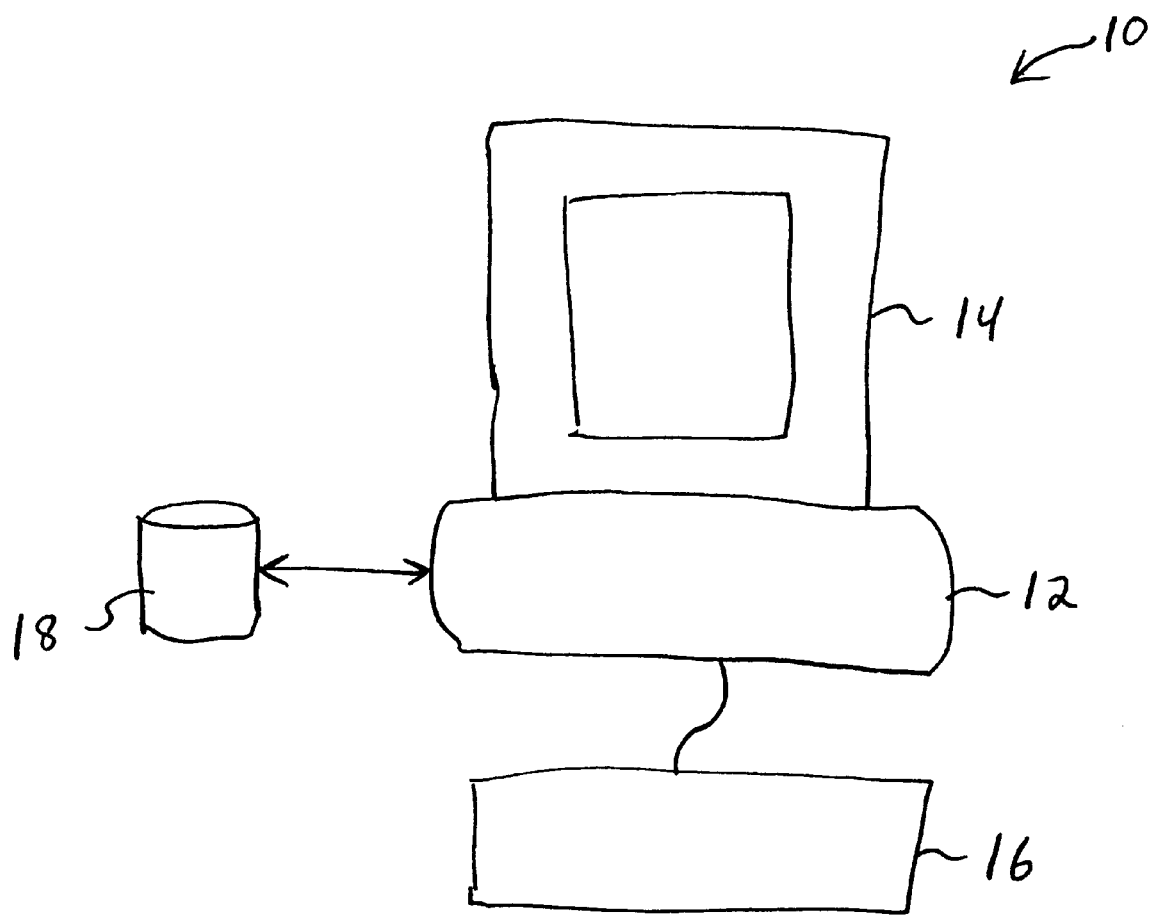
FIG. 1a illustrates a logic synthesis system according to the present invention.

A logic synthesis system 10 is shown in FIG. 1a. FIG. 1a illustrates a workstation having a processing unit 12 connected to a display 14 and a data entry device 16. Processing unit 12 includes a memory device 18 used to store program code according to the present invention.

Logic synthesis system 10 uses the behavioral description of a circuit to synthesize that circuit. In one embodiment, program code installed in the workstation, when executed, modifies the behavioral description as a function of the relative ordering of one or more signals in the circuit and synthesizes the circuit as a function of the modified behavioral description.

Figure 1B:
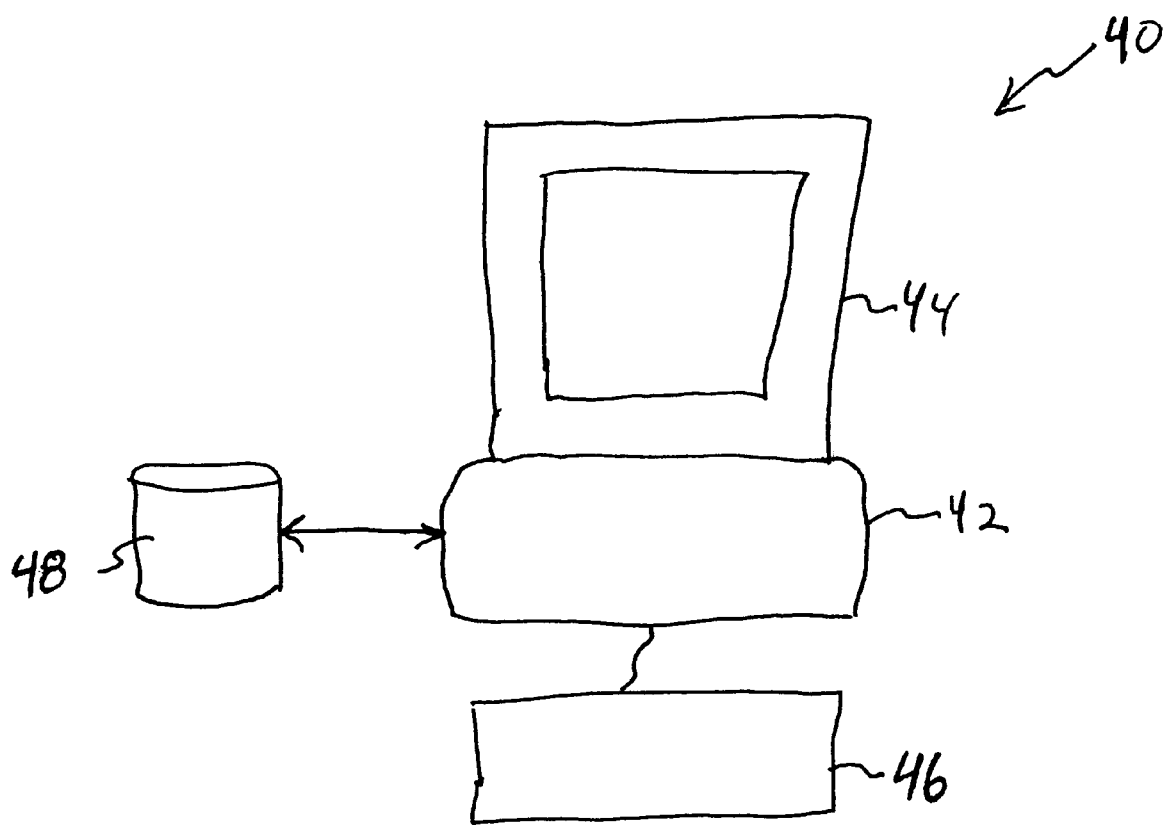
FIG. 1b illustrates a logic verification system according to the present invention.

A logic verification system 40 is shown in FIG. 1b. FIG. 1b illustrates a workstation having a processing unit 42 connected to a display 44 and a data entry device 46. Processing unit 42 includes a memory device 48 used to store program code according to the present invention.

Logic verification system 40 uses the behavioral description of a circuit to verify operation of that circuit. In one embodiment, program code installed in the workstation, when executed, modifies the behavioral description as a function of the relative ordering of one or more signals in the circuit and verifies the circuit as a function of the modified behavioral description.

Relative timing is a new method of representing and reasoning about delays in synchronous and asynchronous circuits. In one embodiment, the designer adds further definition to the behavioral description of a circuit by making assertions regarding relative ordering of events (e.g., signal A goes high before signal B goes low). Synthesis and verification algorithms use these assertions to constrain the large state space and improve on the quality of the synthesis, and to increase the capacity of the verification. In one embodiment, the relative timing constraints are expressed as a system of inequalities that can be proven to hold in any system by examining path delays.

As noted above, the synthesis of speed-independent circuits assumes a delay model that can be considered too conservative for the temporal behavior expected from the actual environment of the circuit and the technology used to implement it. Relative timing constraints, by making some timing assumptions on the behavior of the environment and the circuit itself, allow the designer to simplify the circuit being synthesized. Such a circuit may not, however, retain a crucial property of speed-independent circuits, i.e., the circuit may not react correctly for all possible delays of the components of the system. For this reason, it is crucial to know under which conditions the circuit behaves properly.

Figure 2:
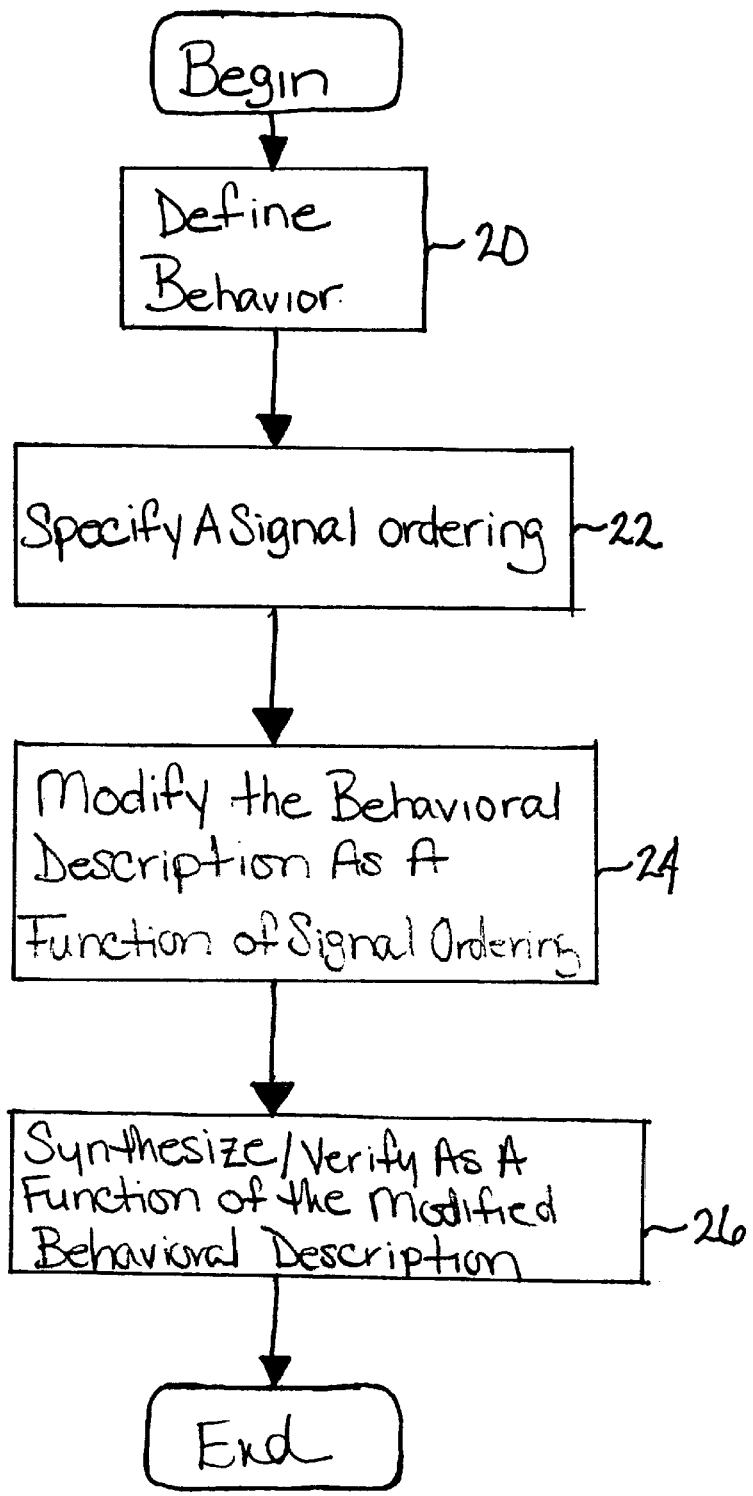
FIG. 2 illustrates a method of synthesizing and/or verifying logic according to the present invention.

One example of an application of relative timing to a behavioral description is shown in FIG. 2. In FIG. 2, at 20 a circuit is described via a behavioral description. At 22, an ordering is defined between two or more signals within the circuit. This ordering is not defined, for instance, by defining when in time the signals change state. Instead, it is defined by a more amorphous relative timing relationship—one that is limited to stating "signal a occurs sometime before signal b". At 24 the behavioral description is modified as a function of the relative timing relationship defined for the signals and at 26 the circuit is synthesized or verified as a function of the modified behavioral description. In one embodiment, logic synthesis system 10 and logic verification system 40 generate relative timing assumptions automatically from the behavioral description. In one such embodiment logic verification system 40 identifies and verifies relative timing constraints in circuits that are not speed independent.

Figure 3:
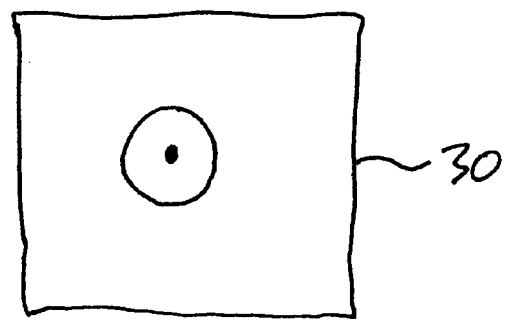
FIG. 3 illustrates a computer readable medium storing program code applying the protocol of FIG. 2.

Program code applying these methodologies can be distributed using computer medium 30 as is shown in FIG. 3.

Relative timing can be used in both asynchronous and synchronous designs to reduce circuit complexity, power and area and increase the performance and testability of the design. For example, application of relative timing to a circuit used in a microprocessor design contributed significantly to a threefold improvement in performance and twofold reduction in power when compared to a similar circuit in a 400 MHz Pentium® processor, all for only a 15% increase in the area of the circuit. In addition, the new circuit had a 95% pseudo stuck-at testability.

Other benefits of applying a relative timing design approach include the ability to simplify the interface to a clocked design, verification support for burst-mode and complex gate synthesis engines, pulse-mode circuits, and hand-designed timed circuits. The numerous benefits and applications of relative timing will be described using design examples, as is detailed below.

In the following discussion, equations are employed to describe relationships between signals in a circuit. In the discussion, input signals are identified by underlining the signal name, inverted signals are identified by placing a # after the signal name, a rising transition is identified by placing a ↑ after the symbol name while a falling transition is identified by placing a ↓ after the symbol name. A signal which is not underlined is an output signal. These conventions are illustrated in Table 1. For CCS, '.' is the sequential operator, '+' is the non-deterministic choice operator, '|' is parallel composition and '\{a}' is the restriction operator applied to a signal a.

| Signal | Description | Example |
|---|---|---|
| input signal | underline | input |
| output signal |  | output |
| inverted (asserted low) | hash mark | z# |
| rising transition | up arrow | a↑ |
| falling transition | down arrow | b↓ |

Figure 4:
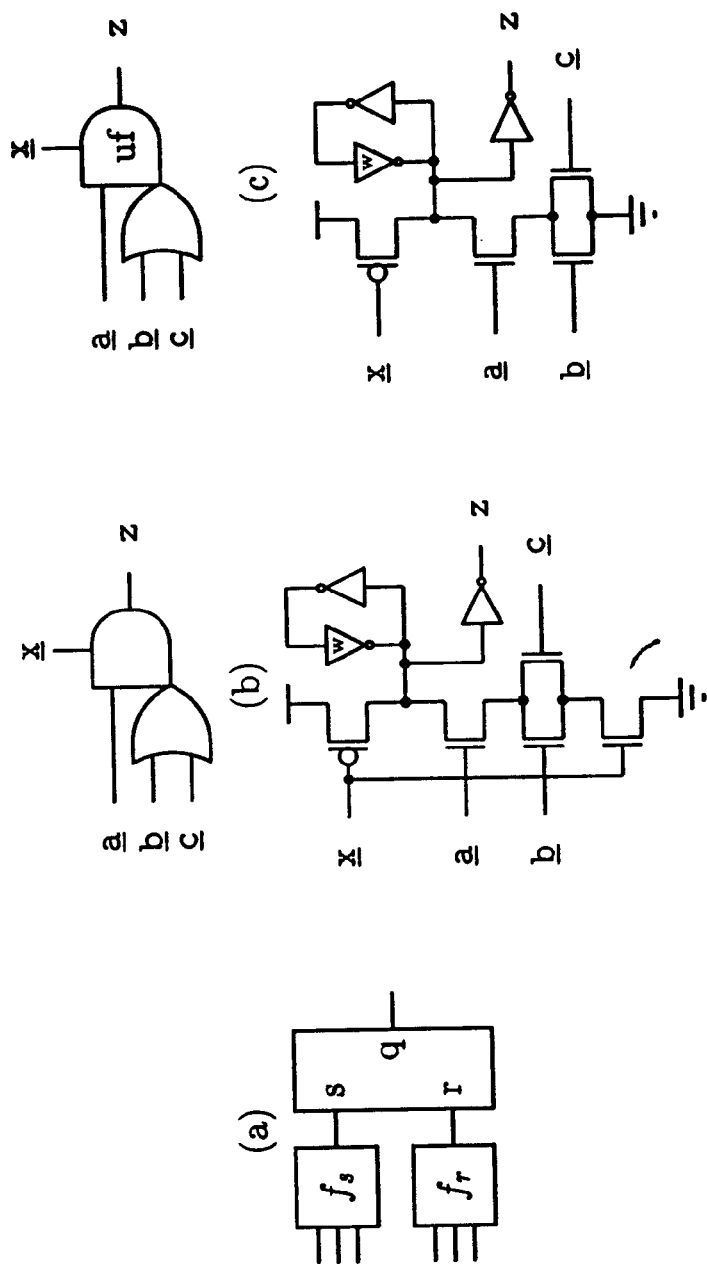
FIGS. 4a–c illustrate synthesis of a set-reset flop.

The following examples are based on non-clocked domino gates employing a single p device. Asynchronous tools such as 3D, ATACS and Petrify can typically synthesize set-reset flops and the appropriate functions (an example is shown in FIG. 4a). Technology mapping can then be used to map the functions of FIG. 4a into single-variable reset (equivalently set) functions, and to implement them using standard footed domino gates as is shown in FIG. 4b. (FIG. 4b illustrates a footed domino gate (symbol and circuit) implementing a Set-Reset flop with $\doteq_r$=x#, $\doteq_s$=xx ax(b+c).) When the reset variable is not used in the set function, an unfooted domino gate is used instead as is shown in FIG. 4c. (FIG. 4c illustrates an unfooted domino gate (symbol and circuit) implementing a Set-Reset flop with $\doteq_r$=x#, $\doteq_s$=ax(b+c).)

A simple two-input generalized C-Element C=(a|b).z.C (as defined in CCS) and its CMOS implementation are shown in FIG. 5a. Given the assumption that RT1: a<b the C-Element is reduced to a buffer: C=b.z.C. If the assumption is limited to the negative edges, RT2: a↓<b↓ the reset function contains only b↓, and the C-Element can be implemented as a footed domino gate (FIG. 5c):C= a↓.b↓.z↓.(a↑|b↑).z↑.C. With a similar assumption on the positive edges, RT3: a↑<b↑ inverted inputs can be applied and the non-buffered z# output of the domino gate can be used. One such approach is shown in FIG. 5d. Alternatively, the output can be buffered for high loads. A "wobbly" C-Element C=a.b.z.C+b.(a.z.C+ b.C), which is unsafe (allowing the input b to toggle and withdraw) can also be synthesized as above.

A static AND-OR C-Element is shown in FIG. 6a. This circuit is not speed-independent, but is safe provided the environment is sufficiently slow. If, for instance, the environment acts fast, b↓ may immediately follow z↑, before node ac has stabilized at '1'. The following requirements can be added to correct the situation:

RT4: bc↑<a↓

RT5: ac↑<b↓

RT1-5 are termed relative timing (RT) predicates. They define various timing assumptions to systems 10 and 40.

In one embodiment, RT4 and RT5 are generated by a verification tool. The verification tool identifies races in the system using its verification algorithms.

These specifications apply to inputs and intermediate variables, and thus the synthesized circuit should ensure these orderings based on environmental delays. These requirements are the same as burst-mode requirements; they guarantee the circuit is stable before new inputs arrive. The following is another set of predicates that are less restrictive because they do not require circuit stability:

RT6: bc↑<ab↓

RT7: ac↑<ab↓

One possible implementation that can guarantee these predicates hold is shown in FIG. 6b, where a buffer is added at the output. All constraints can be made local to the circuit if the buffer delay is large enough to guarantee that act↑ and bc↑ precede z↑. Alternatively, Petrify synthesizes the static complex gate circuit shown in FIG. 6c, which can be verified speed-independent.

Assumptions RT2 or RT3 lead to the simpler static circuits of FIGS. 6d and 6e, respectively. Note that these two circuits are actually subcircuits of the speed-independent one.

FIG. 7 summarizes the five alternative designs. The results are based on simulations made using standard library cell device sizes driving six standard inverters as a load. They were simulated in Spice using MOSIS 0.5$\mu$ process parameters. Except for the static C-Element (SC), all implementations are hazard-free.

As can be seen in FIG. 7, the speed-independent circuit (SIC) is slower than all others, although the relative timing assumption (SIC-RT), which leads to a half size circuit, also enhances performance by 30%. The original static C requires the largest circuit but it is also relatively fast. The reduced domino C-Element (GC-RT) is 15% faster to rise (having only a single pull-up transistor), but is actually slower than the gC on the falling edge.

One approach of applying relative timing to the development of a circuit is to synthesize the circuit as a speed-independent design. The design is then simplified through careful application of relative timing assumptions. An example of such an approach is shown in FIGS. 9a–d, which illustrate the design of a simple FIFO cell.

A simple FIFO cell can be specified in CCS as follows:

LEFT=li↑.c.lo↑.li↓lo↓.LEFT

RIGHT=c.ro↑.ri↑.ro↓.ri↓.RIGHT

FIFO=(LEFT|RIGHT)\{c}      (1)

where c is a label and c is a colabel.

Figure 8A:
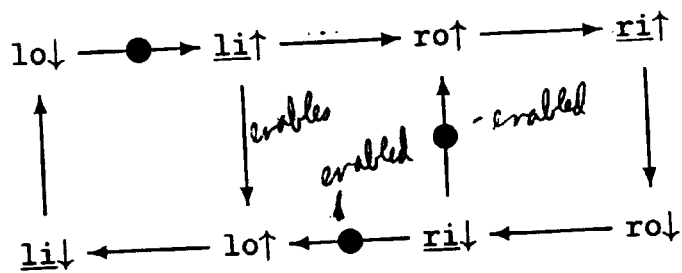
FIGS. 8a–d are Petri net illustrations of a FIFO simplified through the application of relative timing assumptions according to the present invention.

Specification (1) consists of two handshake processes, LEFT and RIGHT. The c signal synchronizes the two processes so that ri must lower and li must raise before both processes may proceed. This process-based specification can easily be mapped to the equivalent petri-net of FIG. 8a. A speed-independent version of the FIFO can be synthesized using Petrify. The resulting circuit is shown in FIG. 9a.

This circuit definition uses the complex gate assumptions where the inverters are zero-delay or are combined with the complex gates. This definition, as well as a physical circuit implementation that includes discrete inverters, can be proven to conform to the specification of the FIFO in Specification (1) using a software package called Analyze.

The circuit of FIG. 9a pays a considerable delay penalty to achieve speed independence. Note, for instance, that lo↑ is produced after three complex gate delays, and ro↑ in four. Performance can be improved if one assumes that a circuit can be built that ensures that concurrent outputs are generated faster than they can be acknowledged by the environment. This assumption can be formulated as follows:

RT8: lo↑<ri↑

RT9: ro↑<li↓

Figure 8B:
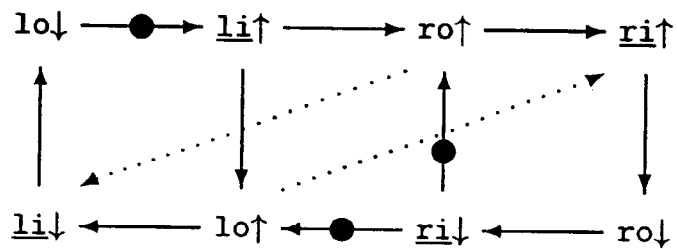

A new specification is generated by adding these two relative timing predicates to the specification. The specification can be represented as:

FIFO∧lo↑<ri↑∧ro↑<li↓     (2)

where FIFO is the specification from Specification (1). This petri-net of FIG. 8b where the dashed arrows are relative timing constraints.

Figure 8C:
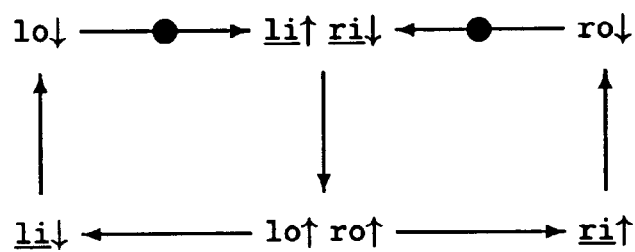

Note that the two relative timing constraints, RT8 and RT9, are in a form where outputs precede inputs. In addition, note from the specification that the outputs are enabled concurrently from a pair of inputs. This is exactly a burst-mode constraint where the input burst is {li↑ri↓} and the output burst is {lo↑ro↑}. The relative timing (RT) predicates constrain the environment so that both outputs are produced before either input is passed to the circuit. A Petri net showing this burst-mode behavior has been derived from the Petri net of FIG. 8b. It is shown in FIG. 8c. Incorporating the RT predicates RT8 and RT9 directly into Specification (1) produces the Mealy state machine of FIG. 10. This new form is suitable for synthesis through 3D and results in the symmetric circuit definition of FIG. 9b, which is hazard free with zero-delay inverters.

This symmetric circuit definition conforms to Specification (2), and achieves a considerable performance improvement over the speed-independent definition. Mapping the circuit definition of FIG. 9b to a physical implementation such as that shown in FIG. 11, however, reveals a problem. The circuit does not conform unless the inverters have zero delay. Unbounded delay in the inverters results in critical races which can cause the physical implementation to fail to conform to the specification. Fortunately, relative timing can be applied to the physical circuit to order these races in such a way that the circuit can conform to the specification. The following are the RT constraints that the circuit must meet in order to avoid the races.

RT10: y2#↑<li↑

RT11: y2#<ri#

RT12: li#↓<ro↑

These constraints were generated by verification algorithms; they apply only to the physical implementation and must be validated by a timing verifier to ensure that the races are not critical.

A further modification of the speed-independent circuit of FIG. 9a is possible. Assume that the circuit of Specification (2) can be placed in a large ring with a single token. If the ring is sufficiently large, circuit delays will ensure that the token will always arrive at an idle cell. In a large ring, therefore, the handshake in the process RIGHT will always complete and the RIGHT interface will become idle before the LEFT interface becomes active.

The SI or BM circuit can safely be used in such an environment. If, however, one takes advantage of the timing of the system a vastly improved circuit (in terms of power, performance, area and testability) can be synthesized. RT13 is the predicate for this environment:

RT13: ri↓<li↑

Figure 8D:
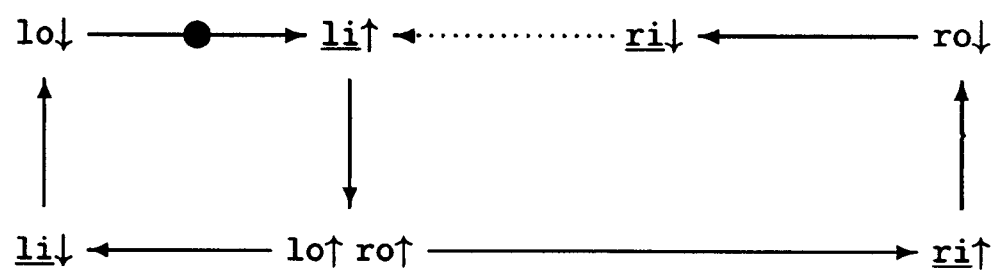

This assumption can be graphically represented as shown in FIG. 8d, where the dotted arc is the relative timing relation shown in RT13.

It should be noted that the dotted arc is not a causal arc; ri must lower before li can raise but ri cannot delay li. That is, the designer is assuming that there will always be a token on the dotted arc; the designer must, therefore, make sure that ri going low will always happen before lo going low.

This represents a major change in the operation of the circuit; the LEFT process is no longer synchronized directly with the RIGHT process. Instead the synchronization is through system timing.

The circuit in FIG. 9c can be synthesized with 3D from specification (2) with the RTpredicate RT13. Signal lo must be generated long enough after li so as to not disable the domino AND gate before it is fully set. This results in a number of RT constraints on critical races in the circuit. If, however, the timing of the lo signal can be correctly adjusted in the system to satisfy the RT constraints and to eliminate races, the result is the fast, small, testable circuit shown in FIG. 9c.

A pulse-mode FIFO cell can also be designed through the use of relative timing constraints applied to a program such as ATACS. As an alternate approach a pulse-mode circuit can be derived from RT13.

Through transitivity of the timing assumption shown in FIG. 8d, ro↓ must precede li↑, allowing us to remove the signal ri↑ altogether. This can be demonstrated by viewing part of the ring as is shown in FIG. 12.

Observe that the lo signal is nothing more than a delayed version of the li signal. Shuffling the lo devices and bubbles results in the circuit of FIG. 13, a circuit that has only forward-moving signals without any feedback. The shuffling that removes acknowledgment is directly based on RT13, which dissociated the LEFT process from the RIGHT. This shuffling removes output lo and input ri, making them local signals.

Note that signal li# in FIG. 13 is just li inverted. A transition li ↑ creates a short period when both li and li# are high, which will set the output of the domino gate. The duration of these signals being high depends on the delay in the li# path. This signal pair can be combined into a single wire li if the signal on this wire operates as a pulse. The final circuit derivation can be seen in FIG. 9d.

The specification for the pulse-mode circuit follows:

LEFTP=li↑. c.li↓.LEFT

RIGHTP=c:ro↑.ro↓: RIGHT

PULSE=(LEFTP|RIGHTP)\{c}ro<li↑     (3)

Designing reliable pulse-mode circuits is very difficult. Some of the constraints of pulse circuits can be observed by understanding how the pulse-mode circuit was derived for this example. FIG. 14 shows a four cycle request-acknowledge handshake. Constraints 1 through 4 are causal with speed-independent signaling. By removing the acknowledgment signal (lo and ri in this case), we are left only with a request signal that requires constraints 2p and 4p. These constraints contain both minimum and maximum metric bounds. However, the actual requirements for the size of these bounds can be represented with relative timing arcs.

Interestingly, these arcs correspond to a protocol very similar to the standard request acknowledge handshaking. The pulse on li of FIG. 9d causes the output pulse ro, as required by specification (3). If we map req to li and ack to ro in FIG. 14, we see that arc 1 is causal.

This circuit can fail, however, if the pulse is so short that lo↑ (ack↑) does not occur. This can be prevented by placing a relative timing transition that requires lo↑ (ack↑) before li↓ (req↓). This makes arc 2 in FIG. 14 an RT predicate, and slightly restricts the specification. (It may be possible to not restrict the specifications behavior if an internal signal toggles which ensures the domino gate has changed state.)

The circuit will also fail if the li (req) pulse is too long. If ro↓ (ack↓) and y↑ have occurred before li↓ (req↓) then the circuit will fail. Therefore, arc 3 in FIG. 14 is a necessary RT predicate for the circuit to work. Finally, arc 4 is assumed to hold given RT13. We therefore have a system of causal and relative timing relations that must hold in the pulse-mode circuit which directly mimic a four cycle handshake.

The consequences of evolving a simple FIFO-like controller from a speed-independent to a pulse-mode circuit are summarized in FIG. 15. The different circuits are characterized in terms of robustness, performance, area, power, and testability. In the table shown in FIG. 15, delay is expressed in pS, energy is in nJ, area is in transistor count and testability is in stuck-at coverage.

The only circuit that contains a hazard-free implementation, even under the specification timing assumptions, is the speed-independent circuit. However the latency of that circuit is from three to five times slower than the circuits that use relative timing. Furthermore, the circuit shown in FIG. 9a is not fully testable, and the testability degrades as the circuit is used in a more restricted environment. The more aggressive timing assumptions tend to increase the performance of the circuit, reduce the area and power, and generally increase the testability. One of the reasons that testability coverage is increased using relative timing is because many of the redundant coverings are removed when the circuits are optimized for time.

Another example of the use of relative timing design can be see in the design of a portion of a variable length instruction decode, here called a "Tag Unit". Decoding of variable length instructions is inherently a serial process, since the length of any instruction directly depends on the lengths of all previous instructions. The performance of instruction length decoding for many computer architectures depends directly on the speed with which this serial decoding operates. A key component in some such architectures is the Tag Unit used to implement the serial ordering of instructions.

Figure 16A:
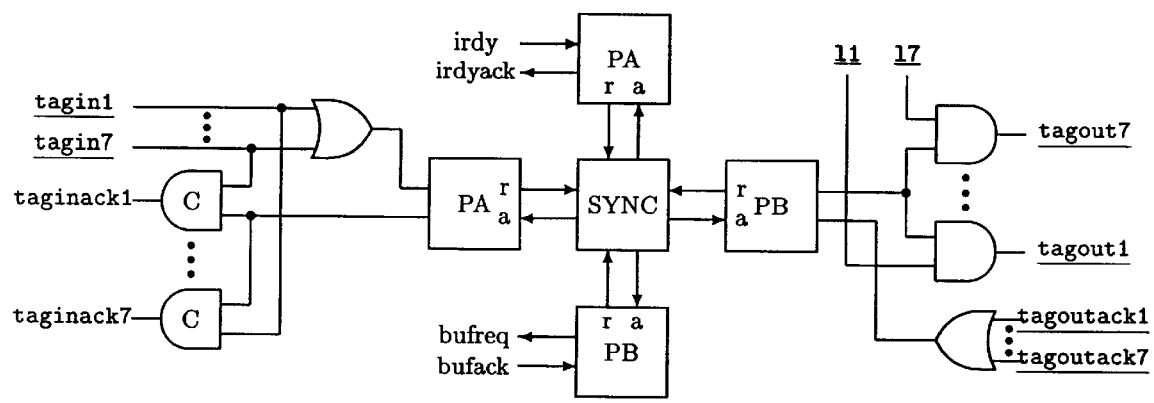
FIGS. 16a and b illustrate the evolution of a Tag Unit through application of a series of relative timing assumptions according to the present invention.

A speed-independent tag unit is shown in FIG. 16a. In this example all the interfaces are treated as speed-independent interfaces. The assumption that all the interfaces are speed-independent interfaces means that all the interfaces require request/acknowledge handshakes; this example assumes a four cycle protocol.

Three processes are needed to implement this box:

PA=r↑.sr↑.sa↑.(sr↓.sa↓|act↑.r↓).a↓.PA

PB=sr↑.sa↑(sr↓.sa↓|r↑.a↓).r↓.a↓.PB

C4=(go0|go1|go2|go3).sa.C4

The two PA processes synchronize the four phase handshake after an r request is received, while the two PB processes are passive and synchronize before handshaking. Therefore, when an irdy and ti request arrives and the bufreq and to cycles have completed, the ti and irdy signals will be acknowledged and the to and bufreq cycles will start. This is accomplished in the specification by renaming the signals and composing the processes as follows:

IRDY=PA[irdy/r, irdyack/a, go0/sr]

TAGIN=PA[ti/r, tia/a, go2/sr]

TAGOUT=PB[to/r, toa/a, go3/sr]

BUFREQ=PB[bufreq/r, bufack/a, go2/sr]

TAGUNIT=(IRDY|TAGIN|TAGOUT|BUFREQ|C4)\{go0, go1, go2, go3, sa}

Figure 17:
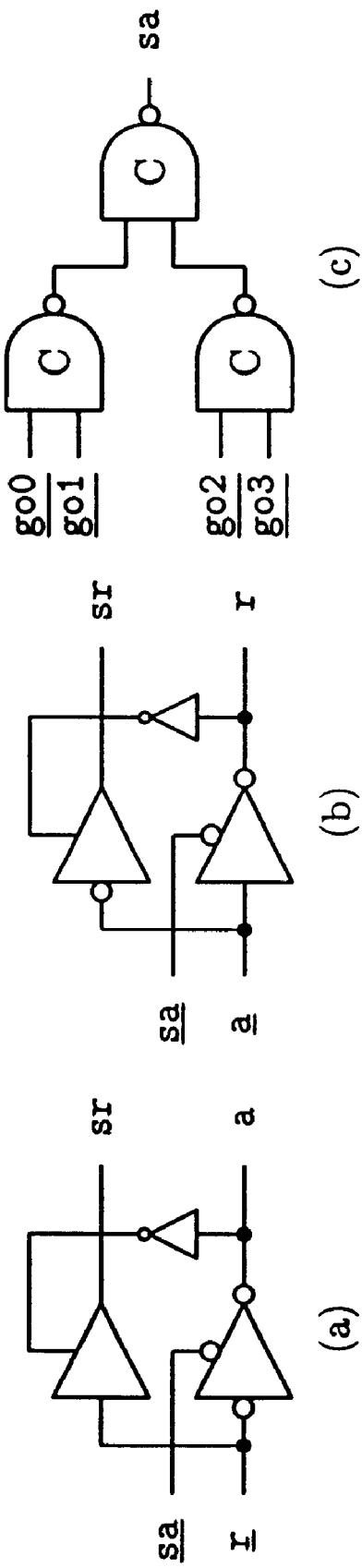

The implementation of these processes using a program such as ATACS is shown in FIG. 17. Processes PA and PB result in very efficient implementations. The large OR gate, C-element, and the necessity of passing through three state machines from the input to output of the tag path, however, creates significant latency in this implementation.

Figure 16B:
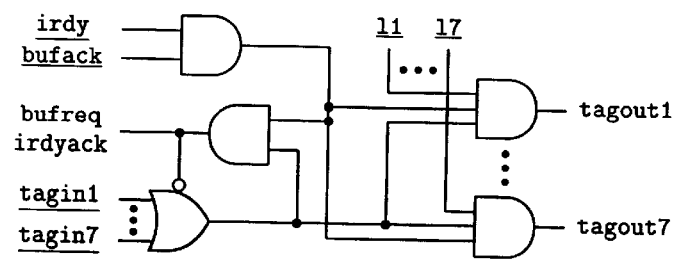

A more efficient circuit is shown in FIG. 16b. This efficient circuit was derived using relative timing constraints as described above. For instance, the mutex assumption in the speed-independent implementation results in the removal of the backward-path handshake for tagin and tagout interfaces. The forward signals are treated as pulses and, therefore, handled as in the FIFO example above. The request and acknowledge protocols on the irdy and bufreq paths are a combination of four cycle and pulse-mode signaling, with irdyack and bufreq being pulses.

A comparison of the speed-independent circuit of FIG. 16a and the RT circuit of FIG. 16b shows that the RT circuit provides substantial benefit in terms of testability, power, and performance. In real-life applications, the area benefit from this approach may be even higher. For instance, in a microprocessor which can be scaled to reach a higher performance, if slow parts are used, higher scaling factors must be employed to meet the target performance. If the slower SI tag unit is used, for example, the area required would have to balloon significantly if stringent performance goals are to be met.

In one embodiment, the RT constraints are generated and verified through a version of Analyze that contains support for RT. All the constraints can be attached to an initial process specification as predicates. This simplifies and clarifies both the initial function of the circuit as well as the assumptions required, as each interface can be specified as a simple process with causal synchronization. Representing the complete behavior constraints or timing constraints as a network, as was shown in the FIFO example above, can be helpful for understanding small examples, but can be confusing and impractical for larger, real-world examples such as the Tag Unit.

In one embodiment, a modified version of a synthesis tool such as Petrify incorporates methods for synthesizing hazard-free circuits under timing assumptions. For instance, in one embodiment, a ".time" parameter has been added in order to convey the relative timing constraints. In addition, in one embodiment an algorithm has been added to the synthesis tool to automatically derive "reasonable" timing assumptions. Finally, in one embodiment, the synthesis tool provides backannotation which indicate the required timing constraints for proper functioning of the circuit. Each of these features will be detailed below.

In one synthesis tool environment, three types of timing assumptions can be specified: firing order of concurrent events, simultaneous occurrence of concurrent events and early enabling. To properly understand the semantics of relative timing constraints, the concepts of enabling region and firing region must be introduced. Given a state graph, the enabling region of event a, EN(a) is defined as the set of states in which a is enabled. The firing region of event a, FR(a), is defined as the set of states in which a is allowed to fire.

Although in speed-independent circuits both concepts are the same (an event can fire as soon as it is enabled), they differ substantially when timing assumptions are considered. An event can be enabled at some state but cannot fire until the system reaches its firing region. All these timing assumptions are specified in the input file where the STG is described. They should go after the graph (or state graph) specification and before the end statement.

A timing assumption based on the firing order of concurrent events is specified with the following syntax:

.time a<|b

The meaning of this statement is the following, "Whenever events a and b are concurrent (i.e. simultaneously enabled and not in conflict), a will always fire before b."

To illustrate how the assumption is made by a synthesis tool such as Petrify we will use the example of FIG. 18. We can observe that events a and b have different relations. They can be concurrent (both enabled in state $s_0$) or ordered (a is enabled in $s_2$ and b is enabled in $s_7$). The timing assumption only applies to those states in which the events are concurrent.

The application of the timing assumption would mean that b will not fire in $s_0$. As a consequence, state $s_1$, will become unreachable in the timed domain.

With regard to event b, Petrify considers that $s_0$ is a "don'↑care" state for the enablement of event b, i.e. after logic synthesis two different solutions could be reported. The first solution would be one in which b is enabled in $s_0$. Still, the timing assumptions will make $s_1$ unreachable, thus b will not fire until $s_6$ is reached.

The second solution would be one in which b is not enabled in $s_0$. In this way, the ordering a→b will be forced by the logic of the circuit, i.e. no timing assumption is required for this solution to be valid.

These two solutions can be formally expressed as follows:

$\{s_6\}=FR(b)\subseteq EN(b)\subseteq\{s_0, s_6\}$ and Petrify will choose a solution for EN(b) that minimizes the cost of the logic.

A timing assumption based on the simultaneous occurrence of concurrent events is specified with the following syntax:

.time a=b@c

An example of this assumption is shown in FIG. 19. The meaning of the simultaneity timing assumption is the following, "Let us take the states in which a and b are enabled and concurrent. Event c will not fire in any of the successor states until a and b have fired. This assumption only applies when c is triggered by either a or b or both."

Informally, this assumption describes the situation in which the firing time difference between a and b is not distinguishable by event c. Looking at the example, this would mean that the system would produce the same observable behavior if c would be "triggered" by b or by both events a and b.

Looking at the state graph of FIG. 19, the simultaneity constraint indicates that c would not fire in state $s_6$ and, therefore, state $s_5$ would become unreachable. On the other hand, event c would be allowed to be enabled in the states $s_1$, $s_4$ and $s_6$. Thus, $\{s_4\}=FR(c)\subseteq EN(c)\subseteq\{s_1, s_4, s_6\}$ The simultaneity timing assumptions can be extended to larger number of events as follows:

.time a=b=c=d@x,y,z meaning that the firing time of events a, b, c and d is considered to be non-distinguishable with respect to events x, y and z.

A timing assumption based on early enabling is specified with the following syntax:

.time c>b

An example of this assumption is shown in FIG. 20. The formal meaning of this assumption is the following, "Let us take all those states s-I in which c is not enabled, but becomes enabled after firing b (i.e., b triggers c). Then the states $s_1$ can potentially belong to EN(c)."

Informally, this assumption indicates that event c can be enabled before it must fire. The delay of the logic implementing c will, however, ensure that c will fire after b. Indeed, this may be seen as a risky assumption, since the logic of signals b and c are not known before logic synthesis. Relative timing assumptions therefore require a post-verification to ensure their validity. If they do not hold after synthesis, some after must be taken. For example, the designer could resynthesize the circuit without the invalid assumptions or change the delays of the components of the circuit (e.g., by transistor sizing or delay padding) so that the assumptions become valid.

In the previous example, EN(c) and FR(c) are defined as follows:

$\{s_6, s_8\}=FR(c)\subseteq EN(c)\subseteq\{s_3, s_4, s_6, s_8\}$

The early enabling assumptions can be extended to chains of events. In the previous example, the following assumptions could also be specified:

c>b>a indicating that EN(c) can be extended up to the enabling of event a. However, no assumption is made about the enablement of b with regard to a.

Timing assumptions can be used in Petrify to synthesize the well-known xyz example shown in FIG. 21. A speed-independent implementation of the behavior with complex gates would be the following:

[x]=z'(x+y');

[y]=x'z';

[z]=y'z+x;

Assume that x, y and z are output signals and that the firing of y+ always occurs before the firing of x-. This can be deduced intuitively from FIG. 21 by observing that y+ is always enabled before x- and that the logic for signal x in the speed-independent implementation looks more complex than the logic for signal y. (All of these assumptions will, of course, be verified after synthesis of the circuit.)

Based on these assumptions, the following timing assumption can be added to the behavioral specification:

.outputs x y z

.graph

```
x+y+z+
z+x-
y+z-
x-z-
z-y-
y-x+
.marking {<y-,x+>}
.time y+<|x-
.end
```
A circuit can then be synthesized with the following command:

petrify xyz.g -cg -topt -eqn xyz.eqn -no where the option "-topt" indicates that Petrify must take timing assumptions into consideration to derive logic. The following logic is obtained:

[x]=z'(x+y');
[y]=x'z';
[z]=x;

The synthesized logic is a drastic simplification of the logic for signal z. Petrify has taken advantage of the timing assumption to consider the state 001 as unreachable and implement z as a simple buffer.

But as important as the solution is the feedback that Petrify gives about the timing assumptions used for each solution. In one embodiment, file petrify.log includes different solutions for each signal. In one such embodiment, the following solutions are reported for signal z:

```
z = x
        >triggers(SET):              x+ -) z+
        >triggers(RESET):            x- -) z-
        >4 transistors (2 n, 2 p)
        >Estimated delay: rising = 18.19, falling = 29.19
        >Speed independent (no timing assumptions)
```

The first solution corresponds to the one obtained with timing assumptions. The second one corresponds to the speed-independent implementation. There are two important pieces of information reported for the solutions: timing assumptions and trigger signals.

In the embodiment shown, Petrify indicates under timing assumptions that the solution z=x is only valid under the assumption that y+ fires before x. In contrast, the solution z=y'z+x is valid under any timing assumption (i.e., it's speed-independent). In one embodiment, the timing assumptions reported by Petrify are not always the same as any timing assumptions that are part of the specification. Instead Petrify will try to report the less stringent assumptions that make the solution valid.

Under trigger signals, in one embodiment, Petrify indicates which events are triggered by the rising and falling transitions of the signal. Note the difference for the trigger events of z-. In the "timed" solution, y+ is no longer triggering z- since it is assumed to fire before x-. This information is much more relevant when "early enabling" assumptions are done for synthesis.

Another type of timing assumption can be made. For instance, in the xyz circuit y+ and z+ are enabled simultaneously. If the delays of their gates would be similar, we could consider that the firing time of y+ and z+ would not be distinguishable with respect to event x-. The specification would now read as follows:

```
.outputs x y z
.graph
x+y+z+
z+x-
y+z-
x-z-
z-y-
y-x+
.marking {<y-,x+>}
.time y+=z+#x-
.end
```

After executing the same command as above, the following solution is obtained:

[x]=y';
[y]=x'z';
[z]=x;

Any timing assumptions that are algorithmically generated or based on simultaneous enablings may not result in correct solutions and must be checked for validity. Again, in one embodiment the file petrify.log will provides relevant information about timing assumptions. In one such embodiment the file petrify.log contains a number of solutions for x. These solutions can be compared to the speed-independent solution (in "other solutions"):

```
x = y'
        >triggers(SET): y- -) x+
        >triggers(RESET): y+ -) x-
        >2 transistors (1 n, 1 p)
        >Estimated delay: rising = 13.44, falling = 10.75
        >Concurrency reduction: y+==>x-
        >Timing assumptions (early enabling): z+<x-
x = y'z'
        >triggers(SET): y- -) x+
        >triggers(RESET): (y+, z+)-) x-
        >4 transistors (2 n, 2 p)
        >Estimated delay: rising = 27.50, falling = 11.00
        >Timing assumptions (early enabling): z+<x-
[. . . other solutions . . .]
x = z'(x + y')
        >triggers(SET): y- -) x+
        >triggers(RESET): z+ -) x-
        >8 transistors (4 n, 4 p)
        >Estimated delay: rising = 29.38, falling = 11.00
        >Speed independent (no timing assumptions)
```

The solution x=y' is generated by disabling x- in state 101 (where it was initially enabled). This makes states 001 unreachable. But note that, in this case, it is not unreachable due to timing assumptions, but due to the fact that the logic for x does not enable x- in state 101. This is what the message >Concurrency reduction: y+==>x+ means. In other words, the fact that y+ fires before x- fires does not need to be verified by making timing assumptions. It is something that the logic of the circuit already guarantees.

Still, there is another important assumption for that solution:

>Timing assumptions (early enabling): z+<x-

This indicates that x- is enabled in such a way that it becomes concurrent with z+ (now x- is also enabled in state 110). The assumption for correctness is that z+ should fire before x−. To verify that assumption at circuit level, one might need some additional information, i.e., how much early is x− enabled? Again, that information is provided in the section of trigger signals. We may realize that now it is y+ that triggers x− (it was z+ in the speed-independent solution). Thus, by combining these pieces of information one can determine when the enabling of an event is started (trigger events) and when the event is allowed to fire (when other concurrent events have already fired). Now, it is time for the designer to decide whether these assumptions are realistic or can be met by the implementation.

Still, there is another interesting solution that appears in the file petrify.log, i.e., x=y'z'. This solution makes the state 001 again reachable, since x− is enabled in state 101. But x− is also enabled earlier in state 110 and the assumption z+<x− must still be met.

In one embodiment, an important aspect of the information provided by the relative timing implementation of Petrify is that different timing assumptions must be ensured for each different solution of each signal. The selection of one solution for one signal does not affect the assumptions made for other gates. However, the combination of all the solutions for each gate may lead to a set of simpler constraints. In the embodiment of Petrify described above, it is still up to the designer to figure out how the constraints interact. What this embodiment of Petrify does guarantee is that the solutions will be valid if the timing assumptions reported for each individual solution of each signal are met.

In one embodiment, Petrify makes an attempt to automatically generate "reasonable" timing assumptions. Since a number of assumptions are easily derivable by inspection of the structure of the specification, such an approach allows the designer to work mainly in the area of improving the performance of the circuits. That is, Petrify is a tool for simplifying the job of the designer and not a designer substitute. Indeed, in one embodiment, Petrify identifies the assumptions which have been generated automatically and those assumptions that are actually used for each solution. It is then the designer's responsibility to guarantee the validity of the timing assumptions.

The following model is considered for the delay of a signal transition (delay from its enabling time to its firing time):

Non-input signals: each gate implementing a non-input signal has a delay in the interval $[1-\epsilon, 1+\epsilon]$, where $\epsilon < \frac{1}{3}$. Thus, the delay of two gates is always greater than the delay of one gate.

Input signals: have a delay in the interval $[1+\epsilon, \infty]$. Thus, the delay of the environment is always greater than the delay of one gate.

Slow input signals: have a delay in the interval $[k, \infty]$, where k is any arbitrarily large constant. The delay k indicates that the enabling of a slow input signal transition always allows the completion of any internal activity in the circuit (e.g., firing of enabled non-input signals).

Delay padding: the delay of any gate implementing any non-input signal can be lengthened after logic synthesis, e.g. by transistor sizing or delay padding, to meet the required timing assumptions.

The automatic generation of timing assumptions by using this delay model will be illustrated with the example of FIG. 22, where $i_1, \ldots i_4$ are input signals and where the remaining signals are output signals. Moreover, the event $i_4+$ is declared to be "slow" by using the statement:

.slow i4+

The assumptions made on the relative order of two concurrent events, a and b are the following:

1) If a is always enabled before b and a is not an input event, then a is assumed to fire before (.time a<|b ). In the example of FIG. 22 this assumption would apply, among others, to the pairs of events $a \rightarrow i_4+$ and $b+ \rightarrow g+$.
2) If a and b are simultaneously enabled, a is a non-input event and b is an input event, then a is assumed to fire before (.time a<|b ). There is no such case in the example of FIG. 22, but it would correspond to the pair of events $a \rightarrow b+$ if b was an input event.
3) If a and b are simultaneously enabled and both are non-input events, Petrify selects heuristically an order between both (typically this order determines that the event with simpler logic will fire first, although it may not be necessarily true when the actual gates are derived after logic synthesis).
4) No assumptions are done for pairs of events that can be enabled in different order in the untimed domain. For example, for events $i_4+$ and f+ we can find event traces in which $i_4+$ is enabled first (e.g., $i_1+$, b+, c+) and in which f+is first enabled (e.g., $i_1+$, c+, b+).

In one embodiment, if two non-input events, a and b, are enabled simultaneously and another event c is triggered by a or b (or both), a simultaneity assumption is automatically generated (a=b@c). In one such embodiment, Petrify makes this analysis only for pairs of simultaneous events. Assumptions on more than two simultaneous events are left to be specified by the designer. There are several examples of simultaneity assumptions in FIG. 22 (e.g., b+=c+@f+ and r+=s+@h+).

In one embodiment, when several non-input events have a trigger relation among them, Petrify automatically generates early enabling assumptions, taking into account that the delays of the gates can be properly lengthened to meet the ordering relations of the specification. In the example of FIG. 22, there are chains of events that have a trigger relation among them (e.g., $c+ \rightarrow f+ \rightarrow g+ \rightarrow h+$ and $r+ \rightarrow h+$). The following assumptions are automatically generated:

.time f+>c+

.time g+>f+>c+

.time h+>g+>f+>c+

.time h+>r+

In one embodiment, ordering of slow input events is a generalization of the fundamental mode assumption. In one embodiment, Petrify is designed with the constraint that the delay of slow input events is long enough to enable the circuit stabilize when other internal activity is in process. Because of this constraint, Petrify can automatically generate assumptions on the firing order of slow events.

In one such embodiment, timing analysis is performed in such a way that only concurrent non-input events having a common predecessor history with the slow input event are assumed to fire first. This intuitive idea will be more clear after looking at the example in FIG. 22, where only $i_4+$ is a slow input event.

It can be seen by examining FIG. 22 that events $i_4+$ and g+ have a common predecessor event in their history: $i_1+$. Moreover, no other input events precede the enablement of $i_4+$ and g+ since the firing of $i_1+$. If the firing time of $i_1+$ is treated as the starting point for timing analysis (i.e., t=0), the delay model for automatic assumptions indicates that g+ will fire in the interval $[3(1-\epsilon), 3(1+\epsilon)]$, i.e., three gate delays. On the other hand, the firing interval for $i_4+$ will be in the interval $[k+1-\epsilon, \infty)$, where k can be arbitrarily large. Therefore, Petrify will deduce that the firing time for g+ will be always before the one for $i_4+$.

Note that this assumption does not hold when the considered event is h+since $i_4$+ and g+ have no common predecessor event in their history. For a similar reason, no ordering assumption can be made for the firing of $i_4$+ and d+ since an input event ($i_3$+) precedes d+ before meeting the $i_1$+ common preceding event.

Technically, this common point in the history of two events is called local nodal point. An analysis based on local nodal points generalizes the concept of fundamental node typically used for the synthesis of burst-mode specifications. Burst-mode machines work under the assumption that each state of the specification is a global nodal point, i.e. no non-input activity is enabled in the state. From the point of view of specification, fundamental mode does not allow any concurrency between the environment and the circuit.

The notion of a slow input event takes advantage of fundamental mode assumptions (i.e., logic can be simplified) and speed-independent assumptions (i.e., concurrency is not sacrificed). As an example, the definition of slow input events allows the synthesis of a system having several sets of handshake signals. It does this by assuming a "local") fundamental mode operation with each individual handshake, but by also maintaining the concurrency among different independent sets of handshakes. One of these examples is the VME bus controller described in the next section.

Finally, all the automatically generated assumptions for the example of FIG. 22 are listed below:

.time b+<|a+

.time c+<|a+

.time a+<|i4+

.time a+<|e+

.time a+<|f+

.time a+<|g+

.time a+<|h+

.time c+<|b+

.time b+<|i3+

.time b+<|d+

.time b+<|f+

.time b+<|g+

.time b+<|h+

.time c+<|i3+

.time c+<|d+

.time c+<|i4+

.time c+<|e+

.time s+<|h+

.time s+<|r+

.time a+<|i4+

.time c+<|i4+

.time f+<|i4+

.time g+<|i4+

.time f+>c+

.time g+>f+>c+

.time h+>g+>f+>c+

.time h+>r+

.time a+=c+@f+

.time b+=c+@f+

.time r+=s+@h+

Even though the xyz example is simple, significant improvements in logic can be obtained by applying automatic timing assumptions on it. For the xyz example shown in FIG. 21 and without any timing assumption, one would execute the command:

petrify xyz.g –cg –atopt –eqn xyz.eqn –no

The option "–atopt" indicates that Petrify must generate automatic timing assumptions. In the situation where the designer has already specified some assumptions, the new ones are added to the designer's ones. In any case, Petrify takes care that the assumptions automatically generated are not contradictory with the ones specified by the designer. The resulting circuit is shown in FIG. 23.

The circuit shown in FIG. 23 is the solution reported by Petrify in the file xyz.eqn. Since the timing assumptions were generated algorithmically they must be examined for validity. In one embodiment, this can be done by examining the file petrify.log. For instance, in one embodiment the following assumptions have been automatically generated:

| | |
|---|---|
| .time z+ <\|y+ | #concurrency reduction (automatic & simultaneous) |
| .time y+ <\|x– | #concurrency reduction (automatic) |
| .time x+>y–>x–>y+ | #early enabling (automatic) |
| .time x+>y–>z– | #early enabling (automatic) |
| .time x–>z+ | #early enabling (automatic) |
| .time z–>y+ | #early enabling (automatic) |
| .time z–>x– | #early enabling (automatic) |
| .time y–>z– | #early enabling (automatic) |
| .time y–>z–>z–>z+ | #early enabling (automatic) |
| .time y+=z+@x– | #simultaneity (automatic) | and the following information is reported for the solutions:

x = y'
>triggers(SET): y– –) x+
>triggers(RESET): y+ –) x–
>2 transistors (1 n, 1 p)
>Estimated delay: rising = 13.44, falling = 10.75
>Concurrency reduction: y+==>x–
>Timing assumptions (early enabling): z+<x–
. . .
y = z
>triggers(SET): z+ –) y+
>triggers(RESET): z– –) y–
>4 transistors (2 n, 2 p)
>Estimated delay: rising = 18.19, falling = 16.69
>Concurrency reduction z+==>y+
>Speed independent (no timing assumptions)
. . .
z = x
>triggers(SET): x +–) z+
>triggers(RESET): x – –) z–

-continued

>4 transistors (2 n, 2 p)
>Estimated delay: rising = 18.19, falling = 16.69
>Timing assumptions (concurrency): y+<x−

The timing information can be summarized as follows:
1) The firing order z+→y+ is required for the solution x=y' to be valid, but the firing order z+→y+ is enforced by the solution y=z that reduces concurrency and makes the state 110 unreachable; and
2) The firing order y+→x− is required for the solution z=x to be valid, but the firing order y+→x− is enforced by the solution x=y' that reduces concurrency and makes the state 001 unreachable.

The enforced concurrency reduction therefore ensures the validity of the timing assumptions and a speed-independent circuit is obtained. This, therefore, is an example on how concurrency reduction does not always imply a loss of performance. The reduction of logic results in a more efficient circuit.

A more complex circuit will be synthesized next, with an emphasis on a synthesis methodology having relative timing assumptions. The I/O interface of a VME bus controller 100 is shown in FIGS. 24a and 24b. Controller 100 controls the communication of a device 104 with VME bus 106 by controlling a data transceiver 102 using signal D. Controller 100 also includes signals DSr, DSw, DTACK, LDS and LDTACK. Signals LDS and LDTACK are a pair of handshake signals that follow a four phase protocol. Signals DSr and DSw follow a four phase protocol with the output signal DTACK. DSr and DSw indicate the beginning of a READ and WRITE cycle respectively. The timing diagram corresponding to a READ cycle is depicted in FIG. 24b.

STGs corresponding to the READ and WRITE cycles of controller 100 are shown in FIGS. 25a and 25b respectively.

In order to synthesize VME bus controller 100, a specification must be defined that includes the behavior of both the READ and WRITE cycles. This can be done by using choice places in a Petri net formalism that model the nondeterminism of the environment. In this case, the nondeterminism comes from the fact that the environment can choose to initiate a READ or a WRITE cycle after the completion of the previous cycle. An STG 110 describing the complete behavior of the controller is shown in FIG. 26a. Some signal transitions, e.g., 1ds+, have multiple instances in STG 110. Indices 1 and 2 are used in FIG. 26a to distinguish events in the READ and WRITE cycles, respectively.

There is also the possibility of representing the whole behavior in an STG 120 having only one transition for each different label. The STG can be obtained by Petrify by using the command:

petrify vme.g -o vme.1label

This result is shown in FIG. 26b. This representation, however, is much less readable that the previous one. For that reason STG 110 of FIG. 26a is used to synthesize the circuit of controller 100. By using that representation, the specification of timing assumptions becomes much more intuitive, since the timing assumptions can be independently defined for the READ and WRITE cycles.

Figure 27:
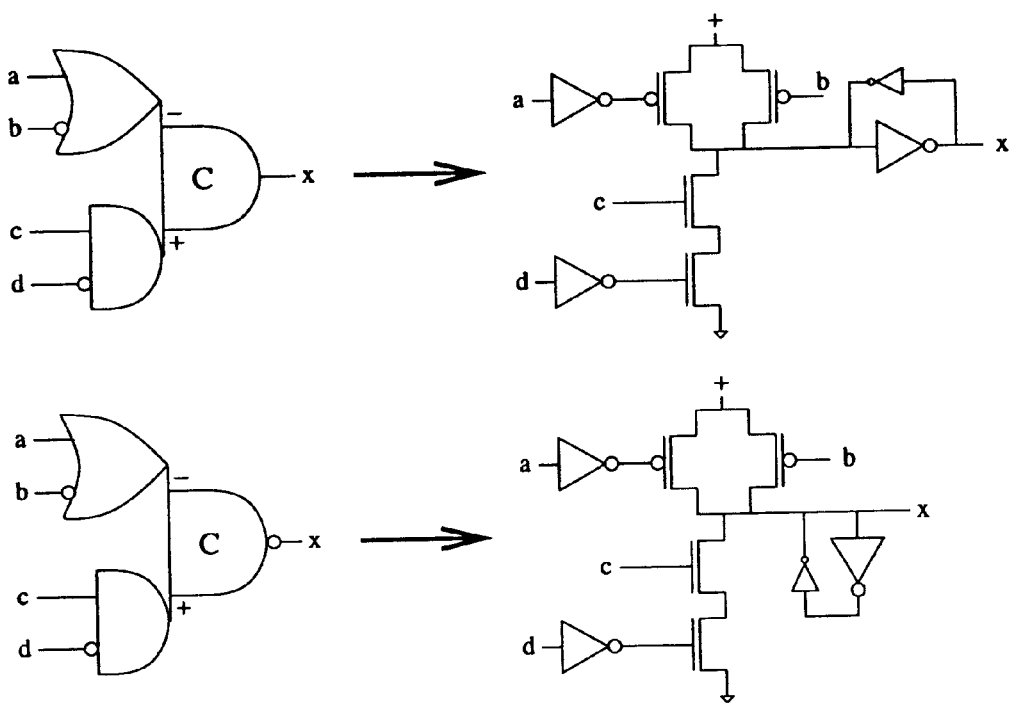
FIG. 27 illustrates the notation used to represent generalized C element.
Figure 28A:
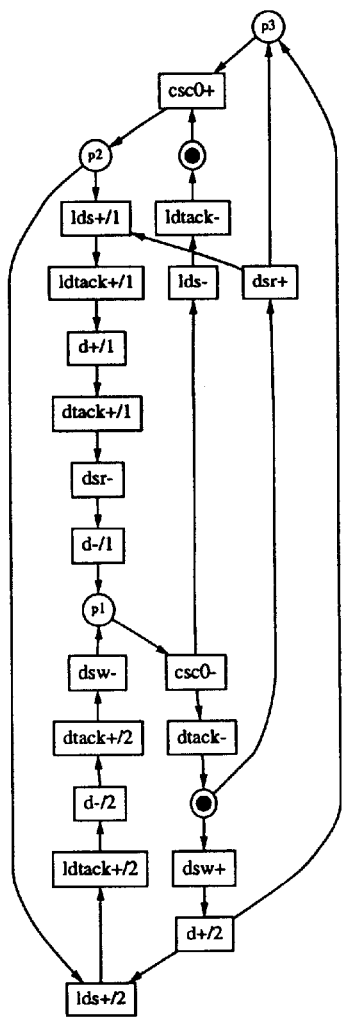
FIGS. 28a and 28b illustrate a specification of the VME bus controller of FIGS. 24a and b and one speed-independent embodiment of that specification.
Figure 28B:
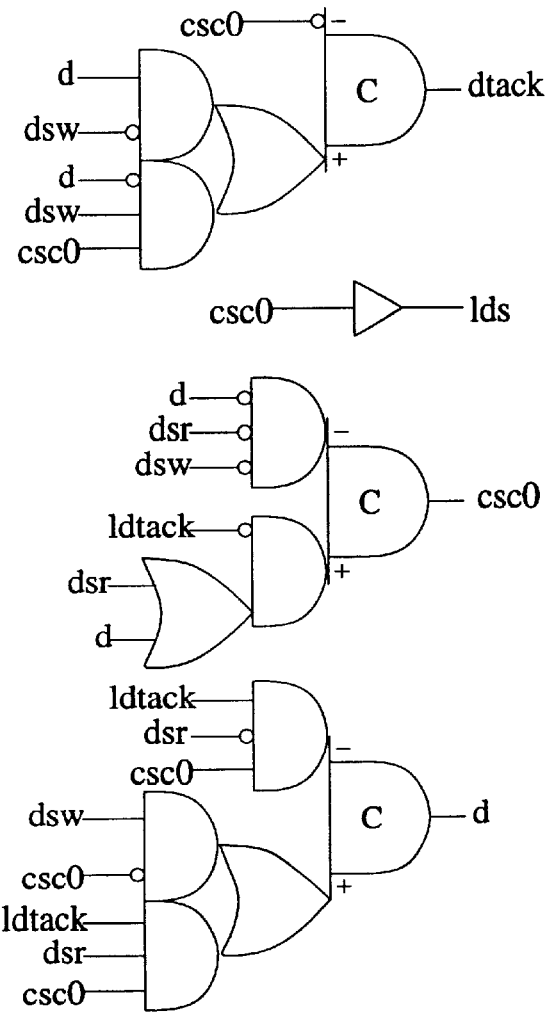

First, a speed-independent implementation of VME bus controller 100 is derived. The notation used for the representation of generalized C elements is shown in FIG. 27. After executing the command petrify vme.g -gc -fr10 -eqn vme.eqn -log vme.log -o vme.csc results in the solution depicted in FIGS. 28a and b, where FIG. 28a illustrates a specification of the VME bus controller of FIGS. 24a and b and FIG. 28b illustrates one speed-independent embodiment of that specification. The option −fr10 increases the width of the exploration when solving CSC conflicts. One internal signal, csc0, has been inserted to encode the states.

Next a slow environment synthesis is described. If one assumes that the response time of the environment is long enough to enable the circuit to complete its internal activity in progress, Petrify can be enabled to generate automatic timing assumptions after having specified the input events as "slow". This can be achieved by including the ".slowenv" statement in the specification and using the option "−atopt" for automatic generation of timing assumptions. In one embodiment, the specification would look like this:

.inputs dsr dsw ldtack
.outputs dtack lds d
.graph p0 dsr+dsw+
p1 lds+/1 lds+/2

Read cycle
   dsr+lds+/1
   lds+/1 ldtack+/1
   ldtack+/1 d+/1
   d+/1 dtack+/1
   dtack+/1 dsr−
   dsr−d−/1
   d−/1 p2 p3

Write cycle
   dsw+d+/2
   d+/2 lds+/2
   lds+/2 ldtack+/2
   ldtack+/2 d−/2
   d−/2 dtack+/2
   dtack+/2 dsw−
   dsw−p2 p3
Return to zero
   p2 lds−
   p3 dtack−
   lds−ldtack−
   dtack−p0
   ldtack−p1
.marking {p0 p1}
Assuming an slow environment
.slowenv
.end and the command would appear as follows:

petrify vme.g -gc -atopt -eqn vme.eqn -log vme.log -no

Figure 29:
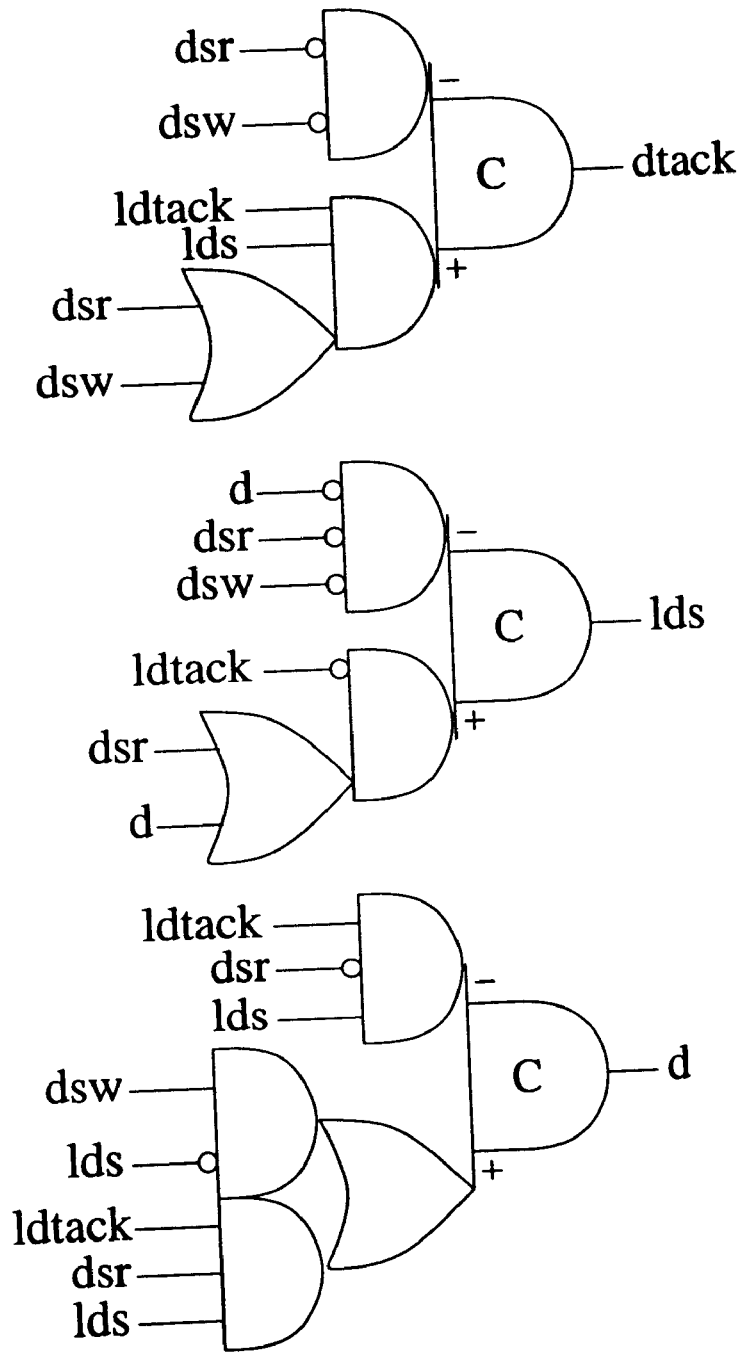
FIG. 29 illustrates a relative-timed embodiment of the circuit of FIG. 28a assuming a slow environment.

The result is shown in FIG. 29. Note that, in this solution, no state signals were inserted to solve the state encoding problem. This is due to the fact that, in general, timing assumptions make some of the states having conflicts unreachable. In this particular case, all conflicts disappear. The automatic timing assumptions generated by Petrify are reported in the file vme.log as:

| | |
|---|---|
| .time lds−<\|dsr+ | #concurrency reduction (automatic) |
| .time lds−<\|dsw+ | #concurrency reduction (automatic) |
| .time lds−<\|d+/2 | #concurrency reduction (automatic) |
| .time dtack−<\|lds− | #concurrency reduction (automatic & simultaneous) |
| .time dtack−<\|ldtack− | #concurrency reduction (automatic) |
| .time lds−<\|dsr+ | #concurrency reduction (automatic) |
| .time lds−<\|dsw+ | #concurrency reduction (automatic) |
| .time dtack−<\|ldtack− | #concurrency reduction (automatic) |
| .time lds+/2>d+/2 | #early enabling (automatic) |
| .time dtack+/1>d+/1 | #early enabling (automatic) |
| .time dtack+/2>d−/2 | #early enabling (automatic) |
| .time lds−>d−/1 | #early enabling (automatic) |
| .time dtack−>d−/1 | #early enabling (automatic) |

Note that the fourth assumption (.time dtack−<|lds−) corresponds to the ordering of two output events that are enabled simultaneous. The message "automatic & simultaneous" indicates two important things: (1) that the assumption has been generated automatically and (2) that both events are enabled simultaneously and Petrify gave priority to one of them when deciding the firing order.

This is one of the cases where the intervention of the designer can be useful. The designer might select, for instance, another firing order by adding a timing assumption in the specification: .time lds−<|dtack−. If the same command is executed with this new timing assumption the vme.log will be the following:

| | |
|---|---|
| .time lds−<\|dtack− | #concurrency reduction (specification) |
| .time lds−<\|dsr+ | #concurrency reduction (automatic) |
| .time lds−<\|dsw+ | #concurrency reduction (automatic) |
| .time lds−<\|d+/2 | #concurrency reduction (automatic) |
| .time dtack−<\|ldtack− | #concurrency reduction (automatic) |
| .time lds−<\|dsr+ | #concurrency reduction (automatic) |
| .time lds−<\|dsw+ | #concurrency reduction (automatic) |
| .time dtack−<\|ldtack− | #concurrency reduction (automatic) |
| .time lds+/2>d+/2 | #early enabling (automatic) |
| .time dtack+/1>d+/1 | #early enabling (automatic) |

-continued

| | |
|---|---|
| .time dtack+/2>d−/2 | #early enabling (automatic) |
| .time lds−>d−/1 | #early enabling (automatic) |
| .time dtack−>d−/1 | #early enabling (automatic) |

Note that the first timing assumption (.time lds−<|dtack−) comes now from the "specification". Petrify cannot, therefore, generate an assumption such as ".time dtack<|lds−" that would contradict the assumption specified by the designer. The resulting circuit is shown in FIG. 30; one can see that there has been improvement in the synthesis of the dtack circuitry by reversing the firing order of dtack− and lds−.

There are other timing assumptions that can be made. For instance, from the specification of controller 100 shown in FIG. 26a, it can be observed that the return-to-zero paths of the protocols at both sides of the controller (bus and device) are done concurrently. We may, therefore, be able to assume that the bus control logic is so slow that any new request for a read or write cycle (dsr+ or dsw+) will never arrive at controller 100 before the handshake with the device has been completed. This can be specified by adding two new timing assumptions:

.time ldtack−<|dsr+ldtack−<|dsw+

The resulting circuit is shown in FIG. 31. This is the lowest cost solution.

The circuit of FIG. 31 (or whichever circuit is to be selected for fabrication) must be analyzed to determine if the assumptions hold. To do this analysis one must first study the information reported in the file vme.log about each gate.

```
SET(dtack') = lds'
RESET(dtack') = ldtack lds
[dtack] = dtack'            (output inverter)
    >triggers(SET):      lds− −> dtack−
    >triggers(RESET):    ldtack+/1 −> dtack+/1 ldtack+/2 −> dtack+/2
    >5 transistors (3 n, 2 p)
    >Estimated delay: rising = 22.94, falling = 16.69
    >Concurrency reduction: lds −==> dtack−
    >Timing assumptions (early enabling): d+/1<dtack+/1 d−/2<dtack+/2
. . .
lds' = dsw' dsr'
[lds] = lds' (output inverter)
    >triggers(SET): (dsr−, dsw−) −> lds−
    >triggers(RESET): dsr+ −> lds+/1 dsw+ −) lds+/2
    >6 transistors (3 n, 3 p)
    >Estimated delay: rising = 18.44, falling = 24.50
    >Timing assumptions (concurrency): ldtack−!dsw+ ldtack−!dsr+
    >Timing assumptions (early enabling): d+/2<lds+/2 d−/1<lds−
. . .
SET (d') = dsr' ldtack
RESET(d') = dsw ldtack' + dsr ldtack
[d] = d' (output inverter)
    >trigger(SET): dsr− −> d−/1 ldtack+/2 −> d−/2
    >triggers(RESET): ldtack+/1 −> d+/1 (dsw+, ldtack−) −> d+/2
    >10 transistors (6 n, 4 p)
    >Estimated delay: rising = 29/88, falling = 29.25
```

```
>Concurrency reduction: ldtack-==>d+/2
>Timing assumptions(concurrency): ldtack-<dsr+
```

The timing assumptions are represented and summarized in FIG. 32. We can distinguish three types of timing arcs in that diagram:
1) Concurrency reduction arcs that denote the additional causality relations enforced by the logic (lds-→dtack- and ldtack-→d+/2). These are not timing assumptions that must be verified for the circuit to be correct.
2) Firing order arcs that indicate the assumed firing ordering of concurrent events for the circuit to be correct. These are timing assumptions that must be verified or enforced by delay padding for the circuit to be correct.
3) Early enabling arcs that indicate the new trigger events for the early enabled events. For example, event lds- that is triggered by d-/1 in the read cycle is now triggered by dsr-. This information is extracted by combining the early enabling timing assumptions and the list of trigger events reported for each solution. These are assumptions that must be verified for the circuit to be correct. In the above-mentioned example, for instance, it must be verified that event d-/1 will occur before event lds-.

The assumptions ldtack-→dsr+ and ldtack-→dsw+ were made in characterizing the speed of the bus control logic. Therefore, they can be considered satisfied. The assumptions on early enabling, however, must be carefully analyzed, since their validity depends on the actual delays of the derived logic.

All the early enabling assumptions rely on the fact that the delay of gate d is shorter than the delay of lds and dtack. Unfortunately, by examining FIG. 31 it can be seen that gate d is more complex than the other gates. The assumption that the delay of gate d is shorter than the delay of lds and dtack cannot hold; the circuit of FIG. 31 must, therefore, be modified to make these assumptions hold true. One possible solution is depicted in FIG. 33. A delay $d_1$ should ensure that lds+/2 and lds- will fire later than d+/2 and d-/1, respectively, even if they are triggered simultaneously. The delay $d_2$ should ensure that dtack+/1 and dtack+/2 will fire later than d+/1 and d-/2, respectively.

Note that the solution shown in FIG. 33 only delays the triggering effect of signal ldtack+ on dtack+. Another solution would have been to add a delay at the output of gate dtack, but this would also delay dtack-, which is not necessary for the correct functioning of the circuit. Thus, it can be seen that the information reported by Petrify allows the designer to customize the circuit such that timing assumptions are met for individual events of a signal, rather than for all the events of the signal.

Relative timing is a useful way of reasoning about designs. The waveforms in databooks are presented in such a way as to highlight the relation between signals and transitions. One can use relative timing to architect systems, as well as synthesize controllers and verify the correctness of systems. Synthesis and verification algorithms can be designed to directly support this concept where time is represented as a relationship similar to a behavioral or causal relation. Relative timing can be applied as aggressively or conservatively as desired. In a restricted form races in speed-independent implementations due to inverter delays can be discovered, and relative timing can be used to show whether the race is critical.

Relative timing does not preclude metric or absolute timing. Metric timing must eventually be applied in the implementation against the RT predicates to prove that they hold. Further, many of the RT predicates require a certain amount of slack, or setup and hold times, in the precedence relations. The robustness and reliability of the circuits can depend directly on the amount of slack on the RT constraints.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of performing logic synthesis from a behavioral description of a circuit, comprising:
defining a signal ordering of signals in the circuit, wherein defining includes specifying a relative ordering of a plurality of events within the circuit as a function of the behavioral description of the circuit, generating a timing assumption automatically within a processor and modifying the relative ordering as a function of the timing assumption;
modifying the behavioral description as a function of the signal ordering; and
synthesizing the circuit as a function of the modified behavioral description.

2. The method according to claim 1, wherein modifying the relative ordering includes receiving a designer-specified timing assumption and further modifying the relative ordering as a function of the designer-specified timing assumption.

3. The method according to claim 2, wherein the designer-specified timing assumption is expressed as a relative timing (RT) predicate.

4. The method according to claim 1, wherein synthesizing includes verifying that the circuit maintains the modified relative ordering of the plurality of events.

5. The method according to claim 4, wherein the relative ordering is expressed as an RT predicate.

6. The method according to claim 1, wherein the timing assumption is expressed as an RT predicate.

7. A method of performing logic synthesis from a behavioral description of a circuit, comprising:
defining a signal ordering of signals in the circuit, wherein defining includes specifying a relative ordering of a plurality of events within the circuit, wherein specifying a relative ordering includes generating a timing assumption automatically within a processor;
modifying the behavioral description as a function of the signal ordering; and
synthesizing the circuit as a function of the modified behavioral description;
wherein the timing assumption is expressed as an RT predicate.

8. A method of performing logic synthesis from a behavioral description of a circuit, comprising:
defining a signal ordering of signals in the circuit, wherein definig includes specifying a relative ordering of a plurality of events within the circuit;

modifying the behavioral description as a function of the signal ordering; and synthesizing the circuit as a function of the modified behavioral description, wherein synthesizing includes verifying that the circuit maintains the relative ordering of the plurality of events;

wherein the relative ordering is expressed as an RT predicate.

9. A method of performing logic verification from a behavioral description of a circuit, comprising:

defining a signal ordering of signals in the circuit, wherein defining includes specifying a relative ordering of a plurality of events within the circuit as a function of the behavioral description of the circuit, generating a timing assumption automatically within a processor and modifying the relative ordering as a function of the timing assumption;

modifying the behavioral description as a function of the signal ordering; and verifying the circuit as a function of the modified behavioral description.

10. The method according to claim 9, wherein modifying the relative ordering includes receiving a designer-specified timing assumption and further modifying the relative ordering as a function of the designer-specified timing assumption.

11. The method according to claim 10, wherein the designer-specified timing assumption is expressed as an RT predicate.

12. The method according to claim 9, wherein verifying includes synthesizing the circuit such that the circuit maintains the modified relative ordering of the plurality of events.

13. The method according to claim 12, wherein the relative ordering is expressed as an RT predicate.

14. The method according to claim 9, wherein the timing assumption is expressed as an RT predicate.

15. A method of performing logic verification from a behavioral description of a circuit, comprising:

defining a signal ordering of signals in the circuit, wherein defining includes specifying a relative ordering of a plurality of events within the circuit, wherein specifying a relative ordering includes generating a timing assumption automatically within a processor;

modifying the behavioral description as a function of the signal ordering; and verifying the circuit as a function of the modified behavioral description;

wherein the timing assumption is expressed as an RT predicate.

16. A method of performing logic verfication from a behavioral description of a circuit, comprising:

defining a signal ordering of signals in the circuit, wherein defining includes specifying a relative ordering of a plurality of events within the circuit;

modifying the behavioral description as a function of the signal ordering; and verifying the circuit as a function of the modified behavioral description, wherein verifying includes synthesizing the circuit such that the circuit maintains the modified relative ordering of the plurality of events;

wherein the relative ordering is expressed as an RT predicate.

17. A logic synthesis system which uses the behavioral description of a circuit to synthesize that circuit, the system comprising;

a workstation having a display and an input device; and program code, installed in the workstation, wherein the program code, when executed, specifies a relative ordering of a plurality of events within the circuit, generates a timing assumption automatically within the workstation, modifies the relative ordering as a function of the timing assumption, modifies the behavioral description as a function of the relative ordering and synthesizes the circuit as a function of the modified behavioral description.

18. The logic synthesis system according to claim 17, wherein the relative ordering is expressed as an RT predicate.

19. The logic synthesis system according to claim 17, wherein the system further includes verification program code, wherein the verification program code, when executed, verifies the circuit as a function of the modified behavioral description.

20. The logic synthesis system according to claim 17, wherein the input device is capable of entering designer-specified timing assumptions and wherein the program code further modifies the behavioral description as a function of the designer-specified timing assumptions.

21. A logic verification system which uses the behavioral description of a circuit to verify that circuit, the system comprising;

a workstation having a display and an input device; and program code, installed in the workstation, wherein the program code, when executed, specifies a relative ordering of a plurality of events within the circuit as a function of the behavioral description of the circuit, generates a timing assumption automatically within the workstation, modifies the relative ordering as a function of timing assumption, modifies the behavioral description as a function of the modified relative ordering and verifies the circuit as a function of the modified behavioral description.

22. The logic verification system according to claim 21, wherein the relative ordering is expressed as an RT predicate.

23. The logic verification system according to claim 21, wherein the input device is capable of entering designer-specified timing assumptions and wherein the program code further modifies the behavioral description as a function of the designer-specified timing assumptions.

24. A circuit, comprising:

a plurality of transistors; and conductors connecting two or more of the plurality of transistors; wherein the conductors are defined and synthesized as a function of a behavioral description of the circuit, wherein the behavioral description includes information specifying a relative ordering between a plurality of events within the circuit, wherein the relative ordering was modified as a function of a timing assumption generated automatically during design of the conductors.

25. The circuit according to claim 24, wherein the information specifying a relative ordering is expressed as one or more RT predicates.

26. An article comprising a computer readable medium having instructions thereon, wherein the instructions, when executed in a computer, create a system for:

representing a circuit through a behavioral description of the circuit;

defining a signal ordering of signals in the circuit, wherein defining includes specifying a relative ordering of a plurality of events within the circuit as a function of the behavioral description of the circuit, generating a timing assumption automatically within a processor and modifying the relative ordering as a function of the timing assumption;

modifying the behavioral description as a function of the signal ordering; and synthesizing the circuit as a function of the modified behavioral description.

27. The method according to claim 26, wherein the relative ordering is expressed as an RT predicate.

28. An article comprising a computer readable median having instructions thereon, wherein the instructions, when executed in a computer, create a system for:

representing a circuit through a behavioral description of the circuit;

defining a signal ordering of signals in the circuit, wherein defining includes specifying a relative ordering of a plurality of events within the circuit as a function of the behavioral description of the circuit, generating a timing assumption automatically within a processor and modifying the relative ordering as a function of the timing assumption;

modifying the behavioral description as a function of the signal ordering; and verifying the circuit as a function of the modified behavioral description.

29. The method according to claim 28, wherein the relative ordering is expressed as an RT predicate.

* * * * *